United States Patent
Shiraishi

(10) Patent No.: US 12,345,765 B2
(45) Date of Patent: Jul. 1, 2025

(54) DETERMINATION DEVICE, TEST SYSTEM, AND GENERATION DEVICE

(71) Applicant: Kioxia Corporation, Tokyo (JP)

(72) Inventor: Mikio Shiraishi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 8 days.

(21) Appl. No.: 18/459,130

(22) Filed: Aug. 31, 2023

(65) Prior Publication Data

US 2024/0133953 A1 Apr. 25, 2024
US 2024/0230759 A9 Jul. 11, 2024

(30) Foreign Application Priority Data

Oct. 21, 2022 (JP) .................................. 2022-169515

(51) Int. Cl.
G01R 31/3193 (2006.01)
G01R 31/317 (2006.01)

(52) U.S. Cl.
CPC . *G01R 31/31932* (2013.01); *G01R 31/31727* (2013.01); *G01R 31/31935* (2013.01)

(58) Field of Classification Search
CPC ........ G01R 31/31932; G01R 31/31727; G01R 31/31935; G01R 31/31717

(Continued)

(56) References Cited

U.S. PATENT DOCUMENTS 3,030,581 A 4/1962 Johnson
3,453,551 A 7/1969 Haberle
(Continued)

FOREIGN PATENT DOCUMENTS

JP H08-502365 A 3/1996
JP H11-205127 A 7/1999
(Continued)

OTHER PUBLICATIONS

Shinsuke Shikama, "Logic circuit (13th)", Setsunan University Faculty of Science and Engineering Department of Electrical and Electronic Engineering, 2011, http://www.setsunan.ac.jp/~shikama/LogicCircuits2009/2011LC_13.pdf, With English Translation (13 pages).

*Primary Examiner* — Albert Decady
*Assistant Examiner* — Osman M Alshack
(74) *Attorney, Agent, or Firm* — Foley & Lardner LLP

(57) ABSTRACT

A determination device includes an estimation circuit and a determination circuit. The estimation circuit generates estimation data by estimating input data in the n-th cycle based on the input data in cycles prior to the n-th cycle and a first generator polynomial. The determination circuit determines whether the input data and the estimation data match. The first generator polynomial is an arithmetic expression that sets the estimation data in the n-th cycle to an inverted value of the input data in (n−1)-th cycle if a logical sum of all the input data in a first period corresponding to a preset number of cycles prior to the n-th cycle is 0 or a logical product of all the input data in a second period corresponding to the preset number of cycles prior to the n-th cycle is 1, and sets the estimation data in the n-th cycle to the same value as the input data in the (n−1)-th cycle if the logical sum is not 0 and the logical product is not 1.

15 Claims, 25 Drawing Sheets

(58) Field of Classification Search
USPC .................................................. 714/724, 781
See application file for complete search history.

(56) References Cited

U.S. PATENT DOCUMENTS

| | | | |
|---|---|---|---|
| 3,530,284 | A | 9/1970 | Wood |
| 5,422,891 | A | 6/1995 | Bushnell et al. |
| 7,299,395 | B2 * | 11/2007 | Fujiwara .......... G01R 31/31932 |
| | | | 714/736 |
| 7,538,558 | B2 * | 5/2009 | Nakamura ....... G01R 31/31717 |
| | | | 324/522 |
| 8,290,032 | B2 | 10/2012 | Asami |
| 2006/0183287 | A1 * | 8/2006 | Collins ................. H04L 1/0065 |
| | | | 438/278 |
| 2007/0198891 | A1 * | 8/2007 | Ishiwaki ............... H03M 13/09 |
| | | | 714/758 |
| 2007/0245194 | A1 * | 10/2007 | Nakamura ....... G01R 31/31727 |
| | | | 714/731 |
| 2009/0103672 | A1 * | 4/2009 | Ichiyama .............. H04L 25/493 |
| | | | 375/371 |
| 2014/0149821 | A1 * | 5/2014 | Zhou ..................... H03M 13/09 |
| | | | 714/758 |
| 2019/0272804 | A1 * | 9/2019 | Amirkhany ............ H03K 21/38 |
| 2021/0083706 | A1 * | 3/2021 | Iwai .................. H04L 25/03057 |
| 2021/0096969 | A1 * | 4/2021 | Murphy ................ G06F 11/221 |
| 2022/0308111 | A1 * | 9/2022 | Feilen .............. G01R 31/31935 |

FOREIGN PATENT DOCUMENTS

| | | |
|---|---|---|
| JP | 2001-298358 A | 10/2001 |
| JP | 2010-096635 A | 4/2010 |
| JP | 4778014 B2 | 9/2011 |

* cited by examiner

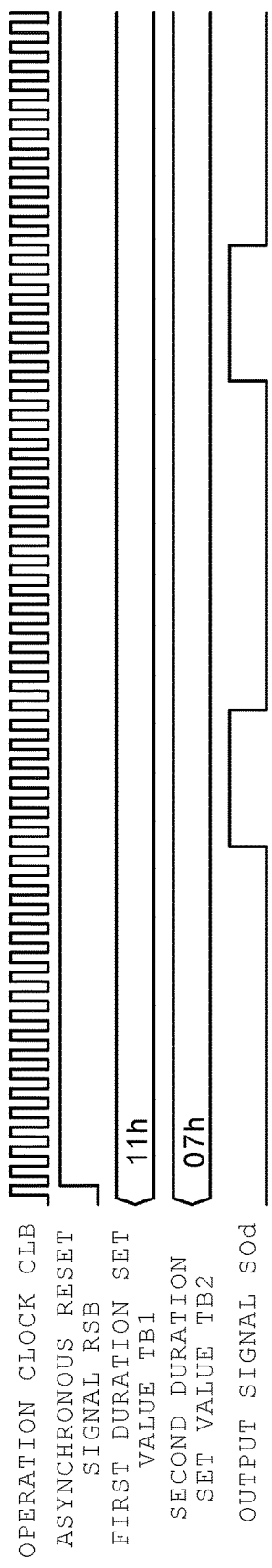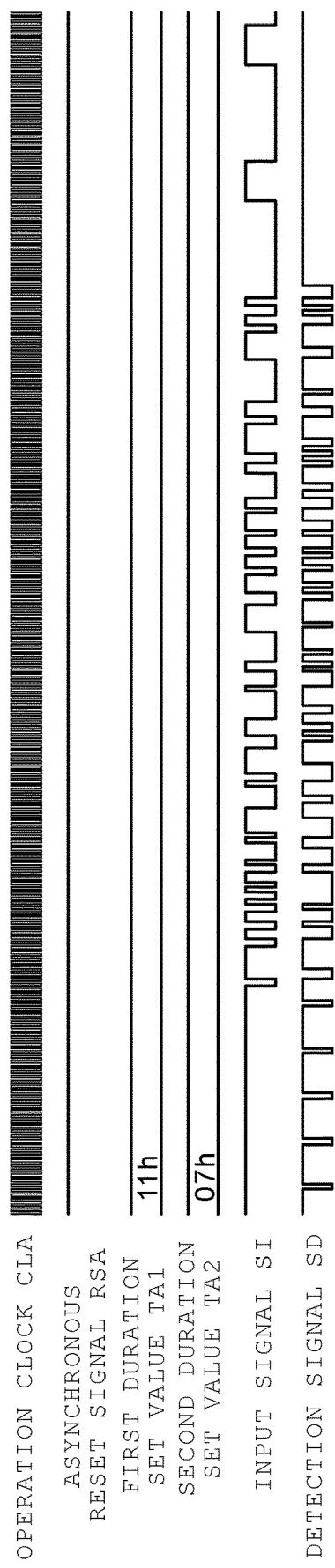

DETERMINATION DEVICE, TEST SYSTEM, AND GENERATION DEVICE

CROSS-REFERENCE TO RELATED APPLICATION

This application is based upon and claims the benefit of priority from Japanese Patent Application No. 2022-169515, filed Oct. 21, 2022, the entire contents of which are incorporated herein by reference.

FIELD

Embodiments described herein relate generally to a determination device, a test system, and a generation device.

BACKGROUND

A method for performing a transmission test on a transmitting circuit, a receiving circuit, and the like, using a serial signal representing a clock-like pattern in which 0's and 1's are alternately repeated at a predetermined period is known. In this transmission test, the transmitting circuit is caused to transmit a serial signal including a clock-like pattern, and the receiving circuit is caused to receive the serial signal. In this transmission test, it is determined whether the data string reproduced from the received serial signal is a clock-like pattern. As a result, in this transmission test, it is possible to test characteristics when the serial signal of the clock-like pattern is transmitted to a transmitting device.

However, in this transmission test of the related art, the received serial signal is bit-aligned, and the bit-aligned data is pattern-matched with a clock-like pattern. In this case, an apparatus having a function of executing this transmission test needs to have a circuit for bit alignment and a circuit for pattern matching, resulting in a large circuit configuration.

DESCRIPTION OF THE DRAWINGS

FIG. 29 is a waveform diagram of output signals and the like according to the fifth embodiment.

FIG. 30 is a waveform diagram of detection signals and the like according to the fifth embodiment.

DETAILED DESCRIPTION

Embodiments provide a determination device, a test system, and a generation device that can easily determine whether an input signal is a clock-like pattern.

In general, according to at least one embodiment, there is provided a determination device including an estimation circuit and a determination circuit. The estimation circuit generates, in an input signal including input data indicating 0's or 1's in each clock cycle, estimation data by estimating the input data in n-th cycle (n is an integer of 2 or more) based on the input data in cycles prior to the n-th cycle and a predetermined first generator polynomial. The determination circuit determines whether the input data in the n-th cycle and the estimation data in the n-th cycle match. The first generator polynomial is an arithmetic expression that sets the estimation data in the n-th cycle to an inverted value of the input data in (n−1)-th cycle if a logical sum of all the input data in a first duration corresponding to a preset number of cycles prior to the n-th cycle is 0 or a logical product of all the input data in a second duration corresponding to the preset number of cycles prior to the n-th cycle is 1, and sets the estimation data in the n-th cycle to the same value as the input data in the (n−1)-th cycle if the logical sum is not 0 and the logical product is not 1.

Embodiments will be described in detail below with reference to the accompanying drawings. It is noted that the present disclosure is not limited by these embodiments.

First Embodiment

Figure 1:
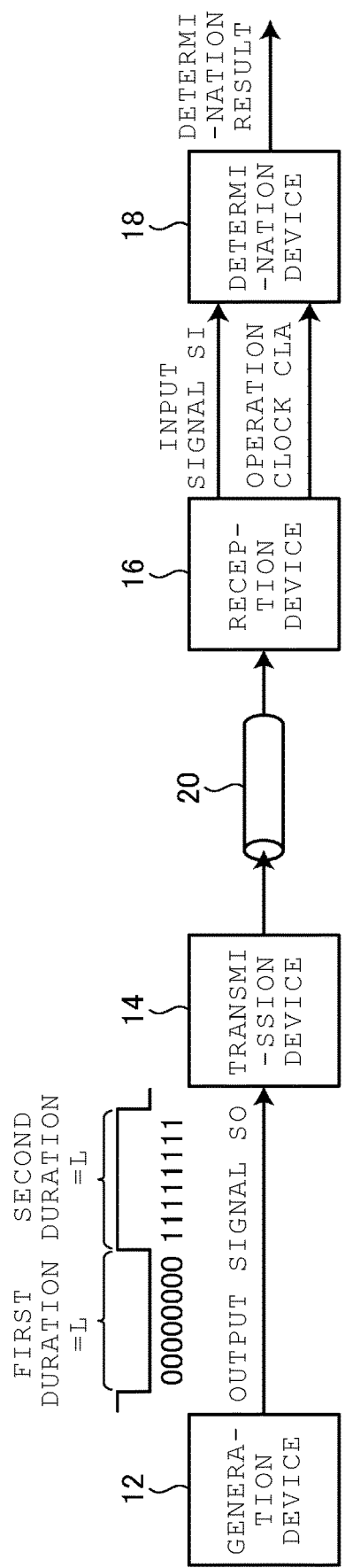
FIG. 1 is a configuration diagram of a test system according to a first embodiment.

FIG. 1 illustrates a test system 10 according to a first embodiment. The test system 10 according to the first embodiment includes a generation device 12, a transmission device 14, a reception device 16, and a determination device 18.

The generation device 12 generates an output signal SO. The generation device 12 provides the generated output signal SO to the transmission device 14.

The output signal SO is a serial signal including output data indicating 0's or 1's in each clock cycle. More specifically, the output signal SO is a serial signal of a clock-like pattern that repeats a pattern in which 0's continue in a first duration corresponding to a preset number of cycles and then 1's continue in a second duration corresponding to a preset number of cycles. In the first embodiment, both the first duration and the second duration are durations corresponding to L cycles (L is an integer of 1 or more).

The transmission device 14 acquires the output signal SO from the generation device 12. The transmission device 14 transmits, to a transmitting line 20, a transmission signal that is obtained by, for example, amplifying the acquired output signal SO. The transmitting line 20 is an example of a transmitting device. The transmission device 14 may transmit, along with the transmission signal, a strobe signal that corresponds to a timing of an operation clock CLA described below to a line other than the transmitting line 20.

The reception device 16 receives the transmission signal from the transmission device 14 via the transmitting line 20. The reception device 16 reproduces an input signal SI from the transmission signal received from the transmission device 14.

The input signal SI is a serial signal including input data indicating 0's or 1's in each clock cycle. If the reception device 16 demodulates the transmission signal without error, the input signal SI is a serial signal with the same clock-like pattern as the output signal SO.

Furthermore, the reception device 16 reproduces the operation clock CLA indicating the clock timing of the input signal SI from the transmission signal. The reception device 16 may receive the strobe signal along with the transmission signal from the line other than the transmitting line 20. The reception device 16 may reproduce the operation clock CLA from the transmission signal, or may reproduce the operation clock CLA from the strobe signal. The reception device 16 provides the reproduced input signal SI and the operation clock CLA to the determination device 18.

The determination device 18 acquires the input signal SI and the operation clock CLA from the reception device 16. The determination device 18 determines whether the input signal SI matches the output signal SO generated by the generation device 12. For example, the determination device 18 determines in each clock cycle whether the input data in the input signal SI matches the output data in the output signal SO. The determination device 18 outputs a determination result representing whether the input signal SI matches the output signal SO. For example, the determination device 18 may output a detection signal SD representing the determination result in each clock cycle as the determination result, or output an error rate representing a ratio of error data (an error bit) in a certain time as the determination result.

The test system 10 can determine whether the input signal SI generated by the reception device 16 matches the output signal SO generated by the generation device 12. As a result, the test system 10 may perform a transmission test with the clock-like pattern.

The generation device 12 and the determination device 18 may be incorporated as part of a built-in self-test (BIST) device provided in a semiconductor device or module. When the generation device 12 and the determination device 18 are incorporated as part of the BIST device, a signal transmitting terminal and a signal receiving terminal of the semiconductor device or module are loopback connected by the transmitting line 20. Thus, the transmission device 14 and the reception device 16 can be connected to each other, and the test system 10 can be configured by the semiconductor device or module. The transmission device 14 and the reception device 16 may be incorporated in separate semiconductor devices or modules instead of being incorporated in the same semiconductor device or module.

In addition, the test system 10 may include a transmitting device such as an amplifier circuit or a buffer circuit instead of, or in addition to the transmitting line 20. As a result, the test system 10 can perform the transmission test on the transmitting device such as the amplifier circuit or the buffer circuit.

Figure 2:
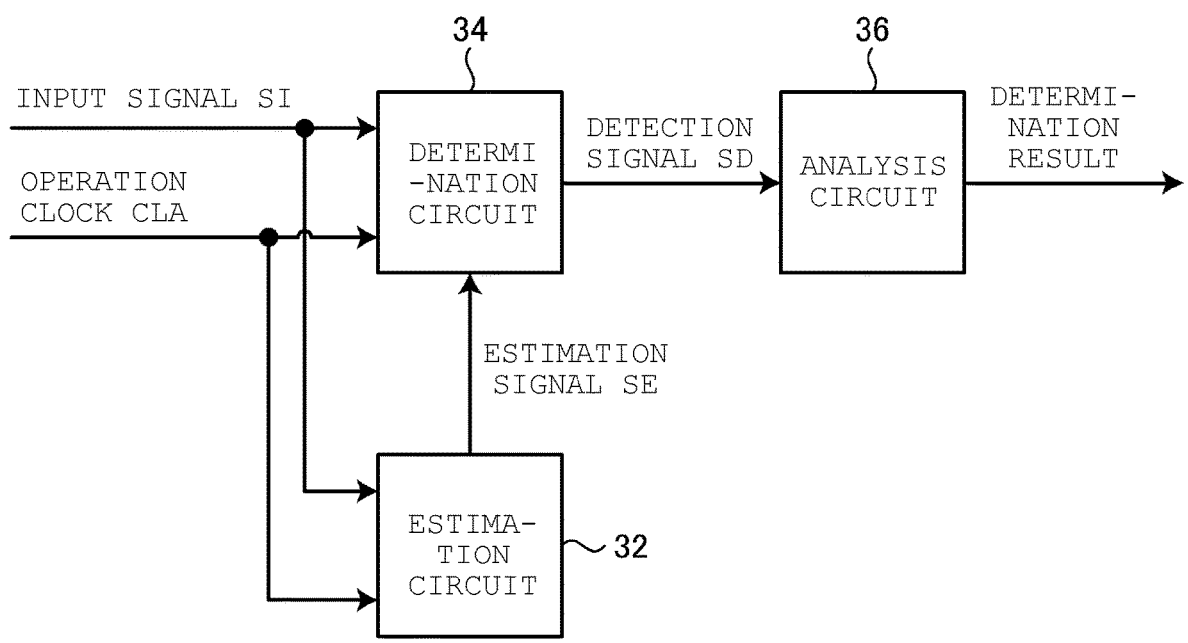
FIG. 2 is a configuration diagram of a determination device according to the first embodiment.

FIG. 2 is a diagram showing a configuration of the determination device 18 according to the first embodiment. The determination device 18 includes an estimation circuit 32, a determination circuit 34, and an analysis circuit 36.

The estimation circuit 32 acquires the input signal SI and the operation clock CLA. The estimation circuit 32 generates an estimation signal SE including estimation data indicating 0 or 1 in each clock cycle. The estimation data represents a value of the input data estimated to be received in each clock cycle.

The estimation circuit 32 generates the estimation data in each clock cycle by estimating the value of the input data based on the input signal SI, the operation clock CLA, and a predetermined first generator polynomial. More specifically, the estimation circuit 32 generates the estimation data by estimating the input data in n-th cycle (n is an integer of 2 or more indicating any clock cycle) based on a plurality of input data in cycles prior to the n-th cycle in the input signal SI and the first generator polynomial. The estimation circuit 32 provides in each clock cycle the estimation signal SE including the estimation data to the determination circuit 34.

The first generator polynomial is an arithmetic expression that sets the estimation data in the n-th cycle to an inverted value of the input data in (n−1)-th cycle if a logical sum of all the input data in the first duration corresponding to a preset number of cycles prior to the n-th cycle is 0 or a logical product of all the input data in the second duration corresponding to the preset number of cycles prior to the n-th cycle is 1. Furthermore, the first generator polynomial is an arithmetic expression that sets the estimation data in the n-th cycle to the same value as the input data in the (n−1)-th cycle if the logical sum of all the input data in the first duration before the n-th cycle is not 0 and the logical product of all the input data in the second duration before the n-th cycle is not 1.

In the first embodiment, the number of cycles in both the first duration and the second duration is L. Therefore, in the first embodiment, the first generator polynomial is expressed by Equation (1).

[Equation 1]

$$y(n) = \begin{cases} \overline{x(n-1)}, & \sum_{k=1}^{L} x(n-k) = 0 \text{ or } \prod_{k=1}^{L} x(n-k) = 1 \\ x(n-1), & \sum_{k=1}^{L} x(n-k) \neq 0 \text{ and } \prod_{k=1}^{L} x(n-k) \neq 1 \end{cases} \quad (1)$$

x(m) represents the input data in m-th cycle. m is an integer indicating any clock cycle. x(m) represents 0 or 1.

A symbol with a bar above x(m) represents the inverted value of x(m). That is, the symbol with a bar above x(m) represents 0 if x(m) is 1, and 1 if x(m) is 0.

y(m) represents the estimation data in the m-th cycle. y(m) represents 0 or 1.

In Equation (1), L represents the number of cycles in the first and second duration.

In addition, $\Sigma$ is a symbol representing the total-sum operation. $\Pi$ is a symbol representing the total-multiplication operation. k is a variable to which a natural number is assigned. Then, the right side of Equation (1) expresses that the value on the left side of the comma is obtained if the condition shown in the expression on the right side of the comma is met.

That is, the upper equation on the right side of Equation (1) expresses that y(n) is an inverted value of x(n−1) if the result of summing x(n−k) with varying k from 1 to L is 0 or the result of multiplying x(n−k) with varying k from 1 to L is 1. In addition, the lower expression on the right side of Equation (1) expresses that y(n) is x(n−1) if the result of summing x(n−k) with varying k from 1 to L is not 0 and the result of multiplying x(n−k) with varying k from 1 to L is not 1.

According to Equation (1), as shown in the upper equation on the right side, y(n) is the inverted value of x(n−1) if 0's continue for L cycles or 1's continue for L cycles. According to Equation (1), as shown in the lower equation on the right side, y(n) is the value of x(n−1) if 0's do not continue for L cycles and 1's do not continue for L cycles. Therefore, by using the first generator polynomial shown in Equation (1), the estimation circuit 32 can generate the estimation data that is estimated when the input signal SI has a clock-like pattern in which 0's continue for L cycles and 1's continue for L cycles based on the past input signals SI.

The determination circuit 34 acquires the input signal SI, the operation clock CLA, and the estimation signal SE generated by the estimation circuit 32. The determination circuit 34 determines in each clock cycle whether the input data in the input signal SI and the estimation data in the estimation signal SE match. More specifically, the determination circuit 34 determines whether the input data in the n-th cycle in the input signal SI and the estimation data of the n-th cycle match. The determination circuit 34 provides in each clock cycle the analysis circuit 36 with a detection signal SD including determination data indicating whether the input data and the estimation data match.

The analysis circuit 36 acquires the detection signal SD from the determination circuit 34. The analysis circuit 36 generates a determination result indicating the result of the transmission test based on the acquired detection signal SD and outputs the generated determination result. For example, the analysis circuit 36 may output the detection signal SD as it is as the determination result, or may calculate the error rate from the detection signal SD and output the calculated error rate as the determination result.

Figure 3:
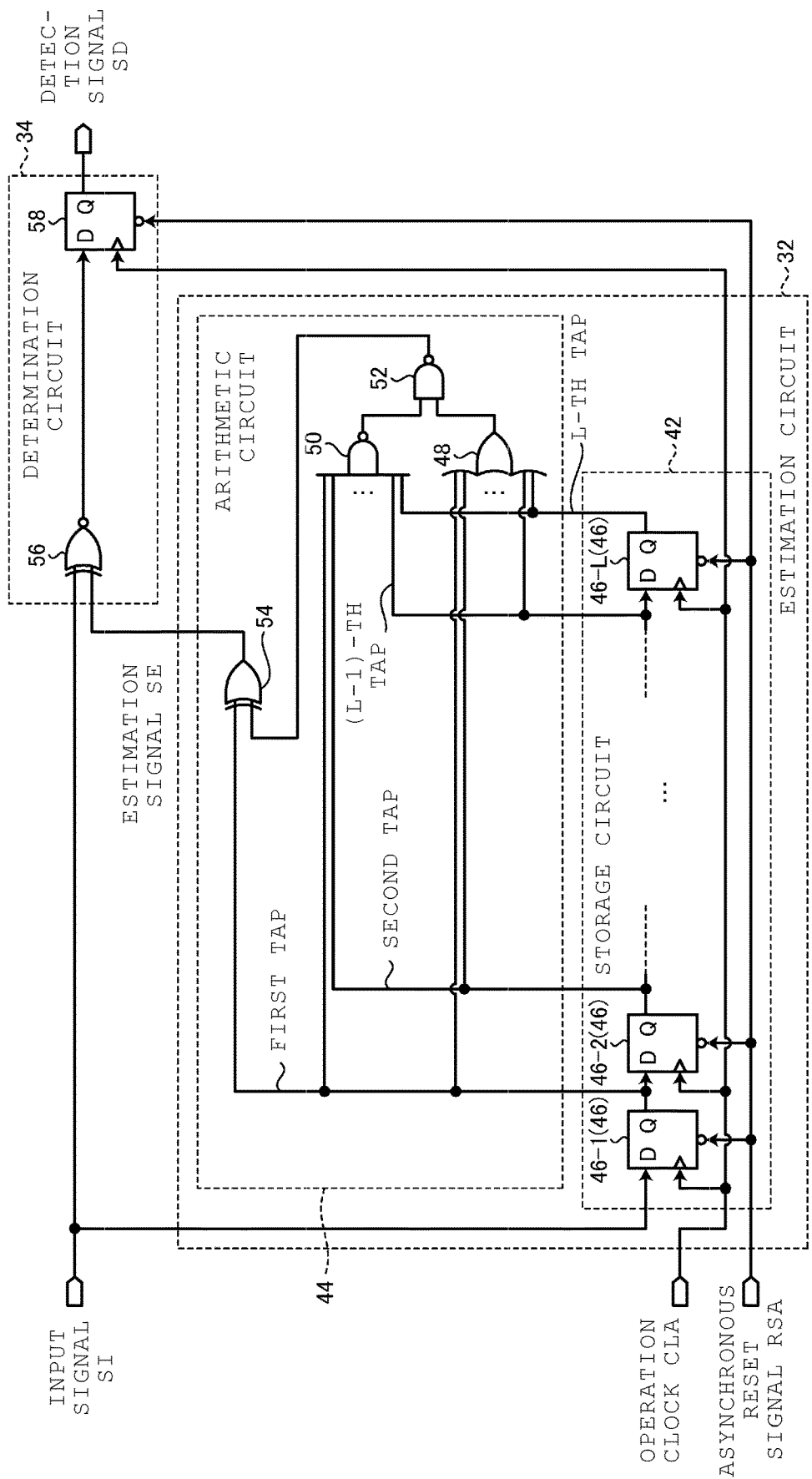
FIG. 3 is a configuration diagram of an estimation circuit and a determination circuit according to the first embodiment.

FIG. 3 is a diagram showing a configuration of the estimation circuit 32 and the determination circuit 34 according to the first embodiment. The estimation circuit 32 according to the first embodiment includes a storage circuit 42 and an arithmetic circuit 44.

The storage circuit 42 acquires the input data in the input signal SI in each clock cycle. Then, the storage circuit 42 stores (L) pieces of input data from (n−1)-th cycle to (n−L)-th cycle in the n-th cycle.

For example, the storage circuit 42 includes (L) D flip-flops 46. The (L) D flip-flops 46 form an L-stage shift register. Each of the (L) D flip-flops 46 receives the operation clock CLA through the clock terminal. The operation clock CLA is a signal synchronized with a clock period of the input data in the input signal SI. Each of the (L) D flip-flops 46 acquires the data input through the D terminal at the timing of the operation clock CLA and stores the acquired data. Each of the (L) D flip-flops 46 outputs the stored data through the Q terminal.

Each of the (L) D flip-flops 46 receives an asynchronous reset signal RSA through the reset terminal at the timing of starting operation, for example. The asynchronous reset signal RSA is a signal asynchronous with the operation clock CLA and is a signal that is received from an external device when starting operation, or resetting, for example. Each of the (L) D flip-flops 46 resets the stored data to a predetermined value of either 1 or 0 if the asynchronous reset signal RSA is 0.

The (L) D flip-flops 46 are configured with a first D flip-flop 46-1 to an L-th D flip-flop 46-L. The first D flip-flop 46-1 of the (L) D flip-flops 46 acquires the input data in the input signal SI through the D terminal. The i-th (i is any integer from 2 to L) D flip-flop 46-i of the (L) D flip-flops 46 acquires, through the D terminal, the data output through the Q terminal of the (i−1)-th D flip-flop 46-(i−1) of the (L) D flip-flops 46.

The (L) D flip-flops 46 can acquire the input data in each clock cycle and store (L) pieces of input data from the (n−1)-th cycle to the (n−L)-th cycle in the n-th cycle.

The arithmetic circuit 44 acquires (L) pieces of input data from the (n−1)-th cycle to the (n−L)-th cycle stored in the storage circuit 42 in the n-th cycle. In the n-th cycle, the arithmetic circuit 44 outputs the inverted value of the input data in the (n−1)-th cycle as the estimation data if the logical sum of all the input data from the (n−1)-th cycle to the (n−L)-th cycle is 0 or the logical product of all the input data from the (n−1)-th cycle to the (n−L)-th cycle is 1. In addition, in the n-th cycle, the arithmetic circuit 44 outputs the same value as the input data in the (n−1)-th cycle as the estimation data if the logical sum of all the input data from the (n−1)-th cycle to the (n−L)-th cycle is not 0 and the logical product of all the input data from the (n−1)-th cycle to the (n−L)-th cycle is not 1.

For example, the arithmetic circuit 44 includes a first OR circuit 48, a first NAND circuit 50, a second NAND circuit 52, and a first EX-OR circuit 54.

The first OR circuit 48 calculates the logical sum of all the input data stored in the storage circuit 42 from the (n−1)-th cycle to the (n−L)-th cycle. The first NAND circuit 50 calculates the inverted value of the logical product of all the input data stored in the storage circuit 42 from the (n−1)-th cycle to the (n−L)-th cycle.

The second NAND circuit 52 performs a logical product operation on the logical sum calculated by the first OR circuit 48 and the inverted value of the logical product calculated by the first NAND circuit 50 so as to calculate an inverted value. As a result, the second NAND circuit 52 can output 1 if the logical sum of all the input data from the (n−1)-th cycle to the (n−L)-th cycle is 0 or the logical product of all the input data from the (n−1)-th cycle to the (n−L)-th cycle is 1. Further, the second NAND circuit 52 can output 0 if the logical sum by the first OR circuit 48 is not 0 and the logical product by the first NAND circuit 50 is not 1.

The first EX-OR circuit 54 acquires the data calculated by the second NAND circuit 52. Further, the first EX-OR circuit 54 acquires the input data in the (n−1)-th cycle through the Q terminal of the first D flip-flop 46-1 in the storage circuit 42. The first EX-OR circuit 54 outputs the exclusive OR of the acquired two pieces of data as the estimation data. That is, in the n-th cycle, if 1 is output from the second NAND circuit 52, the first EX-OR circuit 54 outputs the inverted value of the input data in the (n−1)-th cycle as the estimation data. In addition, in the n-th cycle, if 0 is output from the second NAND circuit 52, the first EX-OR circuit 54 outputs the same value as the input data in the (n−1)-th cycle as the estimation data.

The estimation circuit 32 having the configuration described above outputs in each clock cycle the estimation data calculated by the arithmetic circuit 44 to the determination circuit 34.

The determination circuit 34 acquires in each clock cycle the input data in the input signal SI and the estimation data output from the estimation circuit 32. The determination circuit 34 determines in each clock cycle whether the input data and the estimation data match. Specifically, the determination circuit 34 determines in the n-th cycle whether the input data in the n-th cycle and the estimation data in the n-th cycle match. Then, the determination circuit 34 outputs a detection signal SD indicating whether the input data and the estimation data match in each clock cycle.

For example, the determination circuit 34 includes an EX-NOR circuit 56 and a determination D flip-flop 58.

The EX-NOR circuit 56 acquires the input data in the n-th cycle in the input signal SI and the estimation data in the n-th cycle output from the estimation circuit 32. The EX-NOR circuit 56 outputs the inverted value of the exclusive OR of the acquired two pieces of data. That is, in the n-th cycle, the EX-NOR circuit 56 outputs 1 if the input data in the n-th cycle and the estimation data in the n-th cycle match, and outputs 0 if the input data in the n-th cycle and the estimation data in the n-th cycle do not match.

The determination D flip-flop 58 receives the operation clock CLA through the clock terminal. The determination D flip-flop 58 acquires the data output from the EX-NOR circuit 56 at the timing of the operation clock CLA and stores the acquired data. The determination D flip-flop 58 outputs the stored data through the Q terminal as the detection signal SD. In addition, the determination D flip-flop 58 receives the asynchronous reset signal RSA through the reset terminal. The determination D flip-flop 58 resets the stored data to a predetermined value of either 1 or 0 if the asynchronous reset signal RSA is 0.

The estimation circuit 32 having the configuration described above can generate in each clock cycle the estimation data by estimating the input data by performing the operation of the first generator polynomial shown in Equation (1). Further, the determination circuit 34 having the configuration described above can determine in each clock cycle whether the input data in the input signal SI and the estimation data match.

Figure 4:
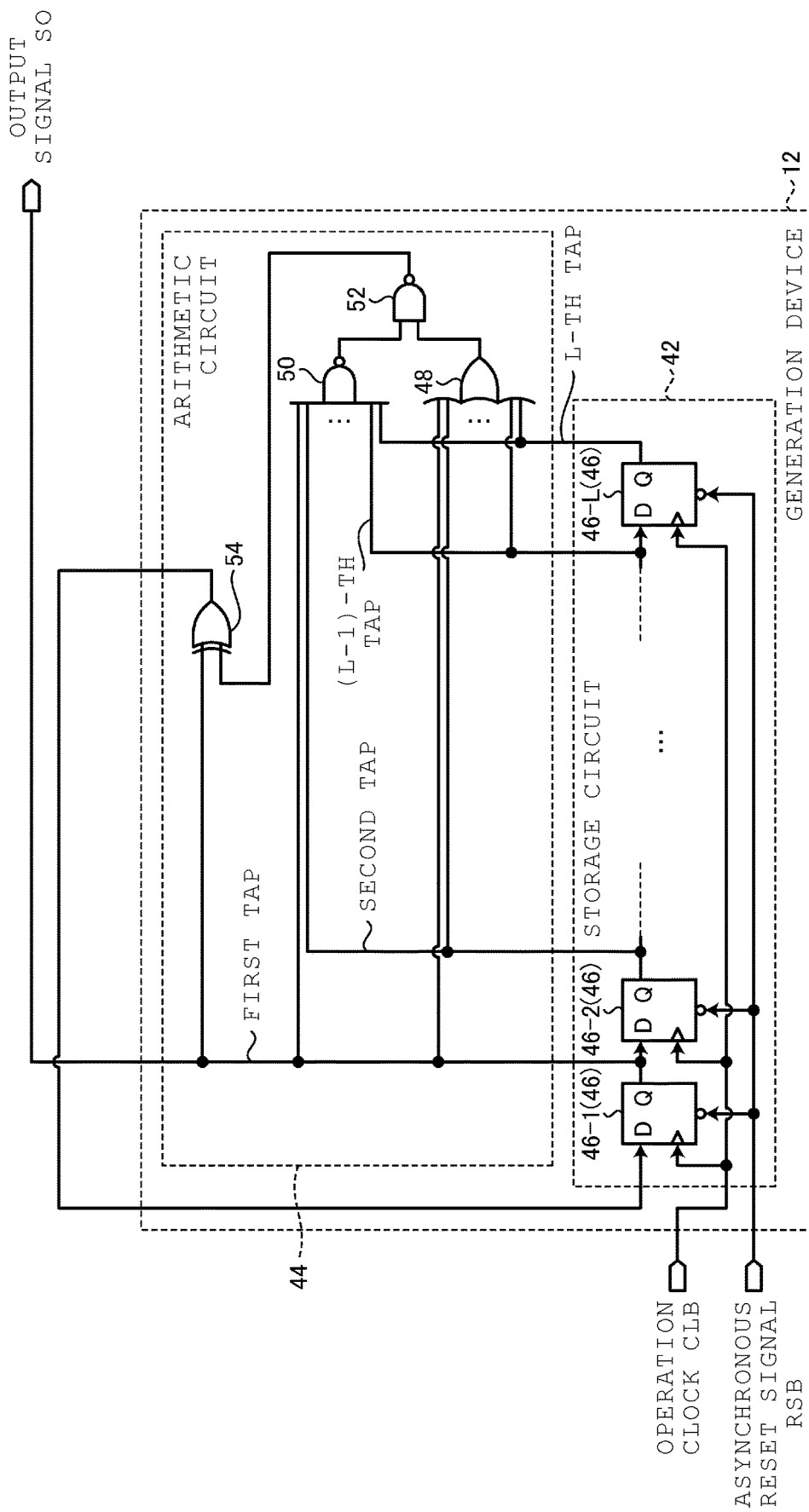
FIG. 4 is a configuration diagram of a generation device according to the first embodiment.

FIG. 4 is a diagram showing a configuration of the generation device 12 according to the first embodiment.

The generation device 12 generates in each clock cycle the output data based on an operation clock CLB and a predetermined second generator polynomial. The operation clock CLB is a clock signal with which the data in the output signal SO output from the generation device 12 is synchronized. More specifically, the generation device 12 generates output data in the n-th cycle based on the output data generated (or transmitted) in cycles prior to the n-th cycle and the second generator polynomial.

The second generator polynomial is an arithmetic expression that sets the output data in the n-th cycle to an inverted value of the output data in the (n−1)-th cycle if a logical sum of all the output data in the first duration before the n-th cycle is 0 or a logical product of all the output data in the second duration before the n-th cycle is 1. The second generator polynomial is an arithmetic expression that sets the output data in the n-th cycle to the same value as the output data in the (n−1)-th cycle if the logical sum of all the output data in the first duration before the n-th cycle is not 0 and the logical product of all the output data in the second duration before the n-th cycle is not 1.

In the first embodiment, the number of cycles in both the first duration and the second duration is L. Therefore, in the first embodiment, the second generator polynomial is expressed by Equation (2).

[Equation 2]

$$z(n) = \begin{cases} \overline{z(n-1)}, & \sum_{k=1}^{L} z(n-k) = 0 \text{ or } \prod_{k=1}^{L} z(n-k) = 1 \\ z(n-1), & \sum_{k=1}^{L} z(n-k) \neq 0 \text{ and } \prod_{k=1}^{L} z(n-k) \neq 1 \end{cases} \quad (2)$$

z(m) represents the output data in the m-th cycle. z(m) represents 0 or 1.

A symbol with a bar above z(m) represents the inverted value of z(m). That is, the symbol with a bar above z(m) represents 0 if z(m) is 1, and 1 if z(m) is 0.

The upper equation on the right side of Equation (2) expresses that z(n) is an inverted value of z(n−1) if the result of summing z(n−k) with varying k from 1 to L is 0 or the result of multiplying z(n−k) with varying k from 1 to L is 1. In addition, the lower expression on the right side of Equation (2) expresses that z(n) is z(n−1) if the result of summing z(n−k) with varying k from 1 to L is not 0 and the result of multiplying z(n−k) with varying k from 1 to L is not 1.

According to Equation (2), as shown in the upper equation on the right side, z(n) is the inverted value of z(n−1) if 0's continue for L cycles or 1's continue for L cycles. In Equation (2), as shown in the lower equation on the right side, z(n) is the value of z(n−1) if 0's do not continue for L cycles and 1's do not continue for L cycles. Therefore, by using the second generator polynomial shown in Equation (2), the generation device 12 can generate an output signal SO with a clock-like pattern that repeats a pattern in which 0's continue for L cycles and 1's continue for L cycles.

For example, if the generation device 12 according to the first embodiment generates the output signal SO using the second generator polynomial, the generation device 12 includes the storage circuit 42 and the arithmetic circuit 44.

The storage circuit 42 has the same configuration as the configuration of the storage circuit 42 shown in FIG. 3. However, in the n-th cycle, instead of acquiring the input data in the n-th cycle in the input signal SI, the storage circuit 42 provided in the generation device 12 acquires the data in the n-th cycle calculated by the arithmetic circuit 44 as the input data in the n-th cycle.

The arithmetic circuit 44 has the same configuration as the configuration of the arithmetic circuit 44 shown in FIG. 3. However, instead of outputting the estimation data to the determination circuit 34, the arithmetic circuit 44 provided in the generation device 12 feeds back the calculated data to the storage circuit 42.

Then, the generation device 12 outputs the output data stored in one of the (L) D flip-flops 46 in the storage circuit 42 in each clock cycle. In the example shown in FIG. 4, the generation device 12 outputs the output data stored in the first D flip-flop 46-1 in each clock cycle to generate the output signal SO.

The generation device 12 having the configuration described above can generate in each clock cycle an output signal SO with a clock-like pattern that repeats a pattern in which 0's continue for L cycles and then 1's continue for L cycles by performing the operation of the second generator polynomial shown in Equation (2).

It is noted that, without using the second generator polynomial, the generation device 12 may generate the output signal SO that repeats a pattern in which 0's continue in the first duration and 1's continue in the second duration by counting the operation clocks CLB with a counter. In the first embodiment, since both the first duration and the second duration are L cycles, the generation device 12 can generate an output signal SO that repeats a pattern in which 0's are generated continuously for L cycles and 1's are generated continuously for L cycles by counting the operation clocks CLB.

Figure 5:
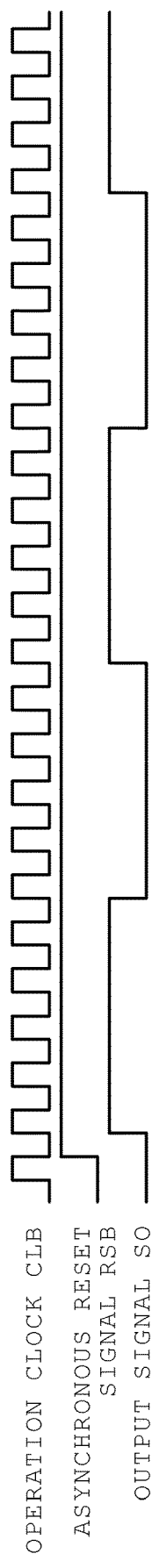
FIG. 5 is a waveform diagram of output signals and the like according to the first embodiment.

FIG. 5 is a diagram showing an example of waveforms of the output signal SO and the like generated by the generation device 12 according to the first embodiment.

If the asynchronous reset signal RSB is 0, the generation device 12 resets (L) pieces of data stored in the storage circuit 42. Then, in response to the asynchronous reset signal RSB being 1, the generation device 12 can output an output signal SO with a clock-like pattern that repeats a pattern in which 0's continue for L cycles and then 1's continue for L cycles. In the example shown in FIG. 5, in response to the asynchronous reset signal RSB being 1, the generation device 12 outputs an output signal SO that repeats a pattern in which 1's continue for L cycles, 0's continue for L cycles and then 1's continue for L cycles. Specifically, in the example shown in FIG. 5, the generation device 12 outputs the output signal SO that repeats a pattern in which 0's continue for 5 cycles and 1's continue for 5 cycles.

Figure 6:
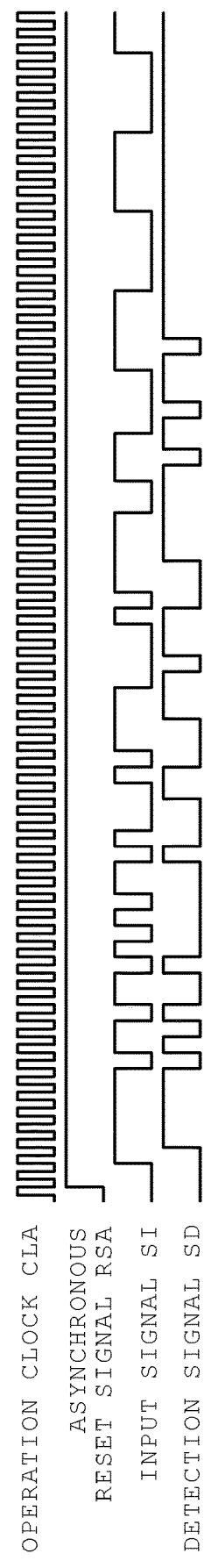
FIG. 6 is a waveform diagram of detection signals and the like according to the first embodiment.

FIG. 6 is a diagram showing an example of waveforms of the detection signal SD and the like generated by the determination device 18 according to the first embodiment.

The determination device 18 can output a detection signal SD that continuously is 1 in cycles in which the input signal SI matches a predetermined clock-like pattern, and is 0 in cycles in which the input signal SI does not match the predetermined clock-like pattern. In the example shown in FIG. 6, the determination device 18 outputs a detection signal SD that is continuously 1 if the input signal SI matches a clock-like pattern in which 0's continue for 5 cycles and 1's continue for 5 cycles, and is 0 if the input signal SI does not match the clock-like pattern.

The test system 10 having the configuration described above can perform the transmission test when a serial signal with a clock-like pattern is transmitted to the transmitting line 20.

In the related art, when the transmission test is performed using a serial signal with a clock-like pattern, the clock-like pattern may be generated using a Johnson counter, for example. When detecting a clock-like pattern from the serial signal, the serial data in the serial signal may be serial-parallel converted, the serial-parallel converted data may be bit-aligned, and the bit-aligned data may be pattern matched.

Meanwhile, the bit alignment is usually performed using special symbols called comma patterns. Therefore, when the clock-like pattern is detected from the serial signal, it is necessary for a transmission side to include the comma pattern in advance in the serial signal, which complicates the circuit on the transmission side. In addition, a receiving circuit that does not perform the bit alignment during normal communication is to be equipped with a separate circuit that performs the bit alignment for testing, which increases the size of the circuit on reception side.

In contrast, the test system 10 according to the present embodiment can generate the estimation data using the first generator polynomial so as to determine whether the input signal SI is a predetermined clock-like pattern without performing the bit alignment. As a result, the test system 10 according to the present embodiment can easily determine whether the input signal SI is a clock-like pattern.

Second Embodiment

A test system 10a according to a second embodiment has substantially the same function and configuration as the test system 10 according to the first embodiment. As for the test system 10a according to the second embodiment, devices, circuits, signals, and the like having substantially the same functions and configurations as those of the first embodiment are given the same names and reference numerals, and detailed description thereof will be omitted except for differences.

Figure 7:
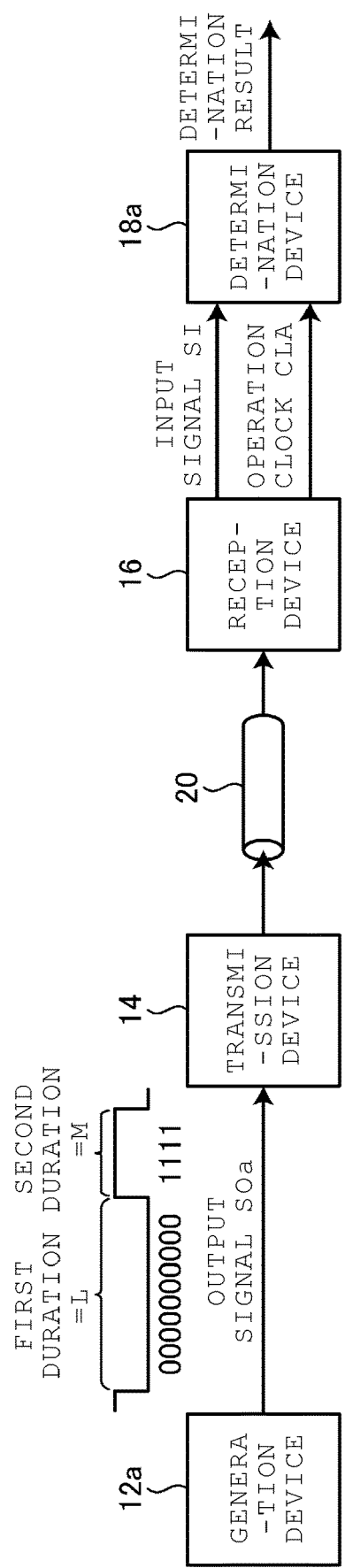
FIG. 7 is a configuration diagram of a test system according to a second embodiment.

FIG. 7 is a diagram showing a configuration of the test system 10a according to the second embodiment. The test system 10a includes a generation device 12a, the transmission device 14, the reception device 16, and a determination device 18a.

The generation device 12a generates an output signal SOa having a first duration longer than a second duration. The generation device 12a provides the generated output signal SOa to the transmission device 14. In the second embodiment, the first duration is L cycles, and the second duration is M cycles (M is an integer of 1 or more and less than L). That is, in the second embodiment, the output signal SOa is a signal of a clock-like pattern that repeats a pattern in which 0's continue for L cycles and 1's continue for M cycles. Further, L>M.

The determination device 18a acquires the input signal SI and the operation clock CLA from the reception device 16. The determination device 18a determines in each clock cycle whether the input data in the input signal SI matches the output data in the output signal SOa. Then, the determination device 18a outputs a determination result indicating whether the input signal SI matches the output signal SOa.

The test system 10a can perform a transmission test with a clock-like pattern in which a duration of consecutive 0's is longer than a duration of consecutive 1's. Then, the test system 10a can also test error characteristics and the like caused by, for example, inter-symbol interference by performing the transmission test with the clock-like pattern in which the duration of consecutive 0's is longer than the duration of consecutive 1's.

Figure 8:
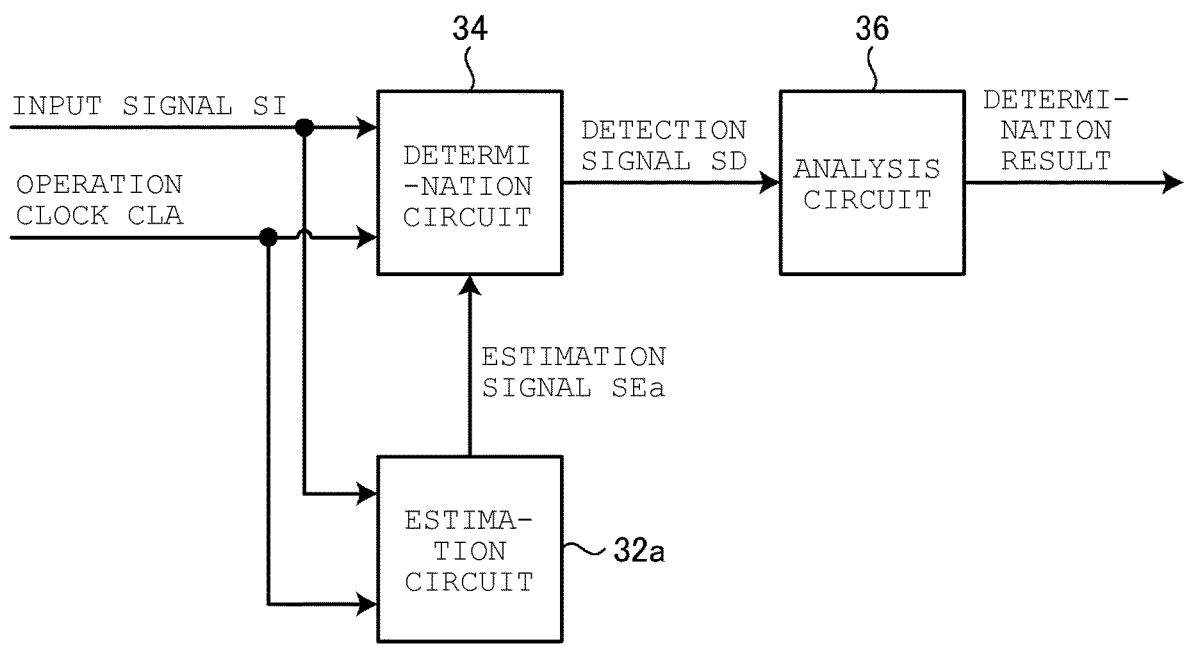
FIG. 8 is a configuration diagram of a determination device according to the second embodiment.

FIG. 8 is a diagram showing a configuration of the determination device 18a according to the second embodiment. The determination device 18a includes an estimation circuit 32a, the determination circuit 34, and the analysis circuit 36.

The estimation circuit 32a acquires the input signal SI and the operation clock CLA. The estimation circuit 32a generates an estimation signal SEa including estimation data indicating 0 or 1 in each clock cycle. The estimation circuit 32a generates the estimation data in each clock cycle by estimating a value of the input data based on the input signal SI, the operation clock CLA, and a predetermined third generator polynomial. The estimation circuit 32a provides in each clock cycle the estimation signal SEa including the estimation data to the determination circuit 34.

In the second embodiment, the number of cycles in the first duration is L and the number of cycles in the second duration is M. Therefore, in the second embodiment, the third generator polynomial is expressed by Equation (3).

[Equation 3]

$$y(n) = \begin{cases} \overline{x(n-1)}, & \sum_{k=1}^{L} x(n-k) = 0 \text{ or } \prod_{k=1}^{L} x(n-k) = 1 \\ x(n-1), & \sum_{k=1}^{L} x(n-k) \neq 0 \text{ and } \prod_{k=1}^{L} x(n-k) \neq 1 \end{cases} \quad (3)$$

The upper equation on the right side of Equation (3) expresses that y(n) is an inverted value of x(n−1) if the result of summing x(n−k) with varying k from 1 to L is 0 or the result of multiplying x(n−k) with varying k from 1 to M is 1. In addition, the lower expression on the right side of expression (3) expresses that y(n) is x(n−1) if the result of summing x(n−k) with varying k from 1 to L is not 0 and the result of multiplying x(n−k) with varying k from 1 to M is not 1.

According to Equation (3), as shown in the upper equation on the right side, y(n) is the inverted value of x(n−1) if 0's continue for L cycles or 1's continue for M cycles. According to Equation (3), as shown in the lower equation on the right side, y(n) is the value of x(n−1) if 0's do not continue for L cycles and 1's do not continue for M cycles. Therefore, by using the third generator polynomial shown in Equation (3), the estimation circuit 32a can generate estimation data that is estimated when the input signal SI has a clock-like pattern in which 0's continue for L cycles and 1's continue for M cycles based on the past input signal SI.

Figure 9:
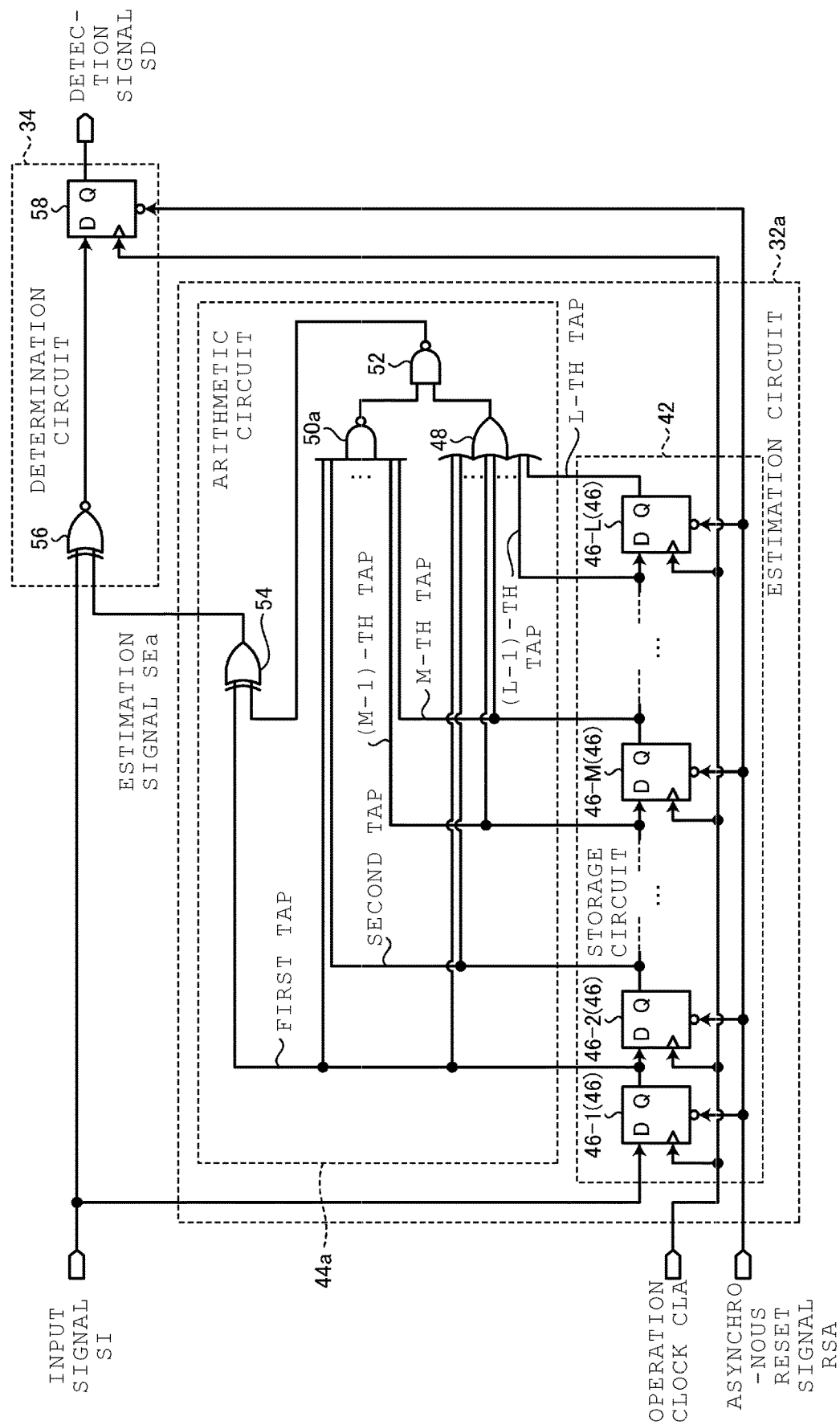
FIG. 9 is a configuration diagram of an estimation circuit and a determination circuit according to the second embodiment.

FIG. 9 is a diagram showing a configuration of the estimation circuit 32a and the determination circuit 34 according to the second embodiment. The estimation circuit 32a according to the second embodiment includes the storage circuit 42 and an arithmetic circuit 44a.

The arithmetic circuit 44a acquires (L) pieces of input data from (n−1)-th cycle to (n−L)-th cycle stored in the storage circuit 42 in the n-th cycle. In the n-th cycle, the arithmetic circuit 44a outputs an inverted value of the input data in the (n−1)-th cycle as the estimation data if a logical sum of all the input data from the (n−1)-th cycle to the (n−L)-th cycle is 0 or a logical product of all the input data from the (n−1)-th cycle to (n−M)-th cycle is 1. In addition, in the n-th cycle, the arithmetic circuit 44a outputs the same value as the input data in the (n−1)-th cycle as the estimation data if the logical sum of all the input data from the (n−1)-th cycle to the (n−L)-th cycle is not 0 and the logical product of all the input data from the (n−1)-th cycle to the (n−M)-th cycle is not 1.

For example, the arithmetic circuit 44a includes the first OR circuit 48, a first NAND circuit 50a, the second NAND circuit 52, and the first EX-OR circuit 54.

The first NAND circuit 50a calculates the inverted value of the logical product of all the input data stored in the storage circuit 42 from the (n−1)-th cycle to the (n−M)-th cycle. The first NAND circuit 50a provides the calculated data to the second NAND circuit 52. The second NAND circuit 52 performs a logical product operation on the logical sum calculated by the first OR circuit 48 and the inverted value of the logical product calculated by the first NAND circuit 50a so as to calculate an inverted value. The estimation circuit 32a having the above configuration outputs in each clock cycle the estimation data calculated by the arithmetic circuit 44a to the determination circuit 34.

The estimation circuit 32a having the configuration described above can generate in each clock cycle the estimation data by estimating the input data by performing the operation of the third generator polynomial shown in Equation (3).

Figure 10:
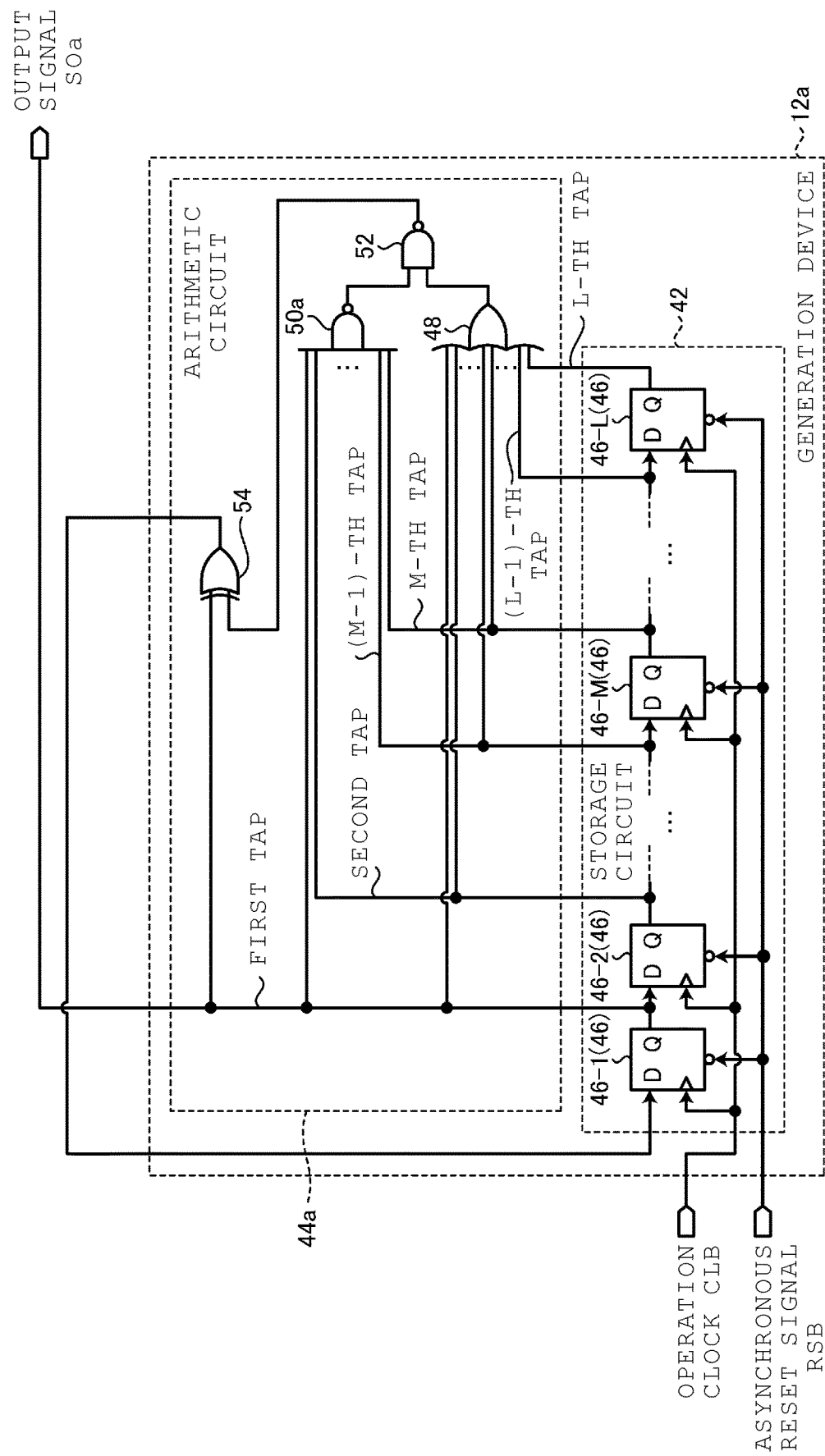
FIG. 10 is a configuration diagram of a generation device according to the second embodiment.

FIG. 10 is a diagram showing a configuration of the generation device 12a according to the second embodiment.

The generation device 12a according to the second embodiment generates the output data in each clock cycle based on the operation clock CLB and a fourth generator polynomial. In the second embodiment, the number of cycles in the first duration is L and the number of cycles in the second duration is M. Therefore, in the second embodiment, the fourth generator polynomial is expressed by Equation (4).

[Equation 4]

$$z(n) = \begin{cases} \overline{z(n-1)}, & \sum_{k=1}^{L} z(n-k) = 0 \text{ or } \prod_{k=1}^{L} z(n-k) = 1 \\ z(n-1), & \sum_{k=1}^{L} z(n-k) \neq 0 \text{ and } \prod_{k=1}^{L} z(n-k) \neq 1 \end{cases} \quad (4)$$

The upper equation on the right side of Equation (4) expresses that z(n) is an inverted value of z(n−1) if the result of summing z(n−k) with varying k from 1 to L is 0 or the result of multiplying z(n−k) with varying k from 1 to M is 1. In addition, the lower expression on the right side of expression (4) expresses that z(n) is z(n−1) if the result of summing z(n−k) with varying k from 1 to L is not 0 and the result of multiplying z(n−k) with varying k from 1 to M is not 1.

According to Equation (4), as shown in the upper equation on the right side, z(n) is the inverted value of z(n−1) if 0's continue for L cycles or 1's continue for M cycles. According to Equation (4), as shown in the lower equation on the right side, z(n) is the value of z(n−1) if 0's do not continue for L cycles and 1's do not continue for M cycles. Therefore, by using the fourth generator polynomial shown in Equation (4), the generation device 12a can generate the output signal SOa with a clock-like pattern that repeats a pattern in which 0's continue for L cycles and 1's continue for M cycles.

For example, if the generation device 12a according to the second embodiment generates the output signal SOa using the fourth generator polynomial, the generation device 12a includes the storage circuit 42 and the arithmetic circuit 44a.

The storage circuit 42 has the same configuration as the configuration of the storage circuit 42 shown in FIG. 9. However, in the n-th cycle, instead of acquiring the input data in the n-th cycle in the input signal SI, the storage circuit 42 provided in the generation device 12a acquires the data in the n-th cycle calculated by the arithmetic circuit 44a as the input data in the n-th cycle.

The arithmetic circuit 44a has the same configuration as that of the arithmetic circuit 44a shown in FIG. 9. However, instead of outputting the estimation data to the determination circuit 34, the arithmetic circuit 44a provided in the generation device 12a feeds back the calculated data to the storage circuit 42.

Then, the generation device 12a outputs the output data stored in one of the (L) D flip-flops 46 in the storage circuit 42 in each clock cycle. In the example shown in FIG. 10, the generation device 12a outputs the output data stored in the first D flip-flop 46-1 in each clock cycle to generate the output signal SOa.

The generation device 12a having the configuration described above can generate in each clock cycle an output signal SOa with a clock-like pattern that alternately repeats a first duration in which 0's continue for L cycles and a second duration in which 1's continue for M cycles by performing the operation of the fourth generator polynomial expressed by Equation (4).

It is noted that, without using the fourth generator polynomial, the generation device 12a may count the operation clocks CLB with a counter so as to generate the output signal SOa that repeats a pattern in which 0's continue in the first duration and 1's continue in the second duration. In the second embodiment, since the first duration is L cycles and the second duration is M cycles, the generation device 12a generates an output signal SOa that repeats a pattern in which 0's are generated continuously for L cycles and 1's are generated continuously for M cycles by counting the operation clocks CLB.

Figure 11:
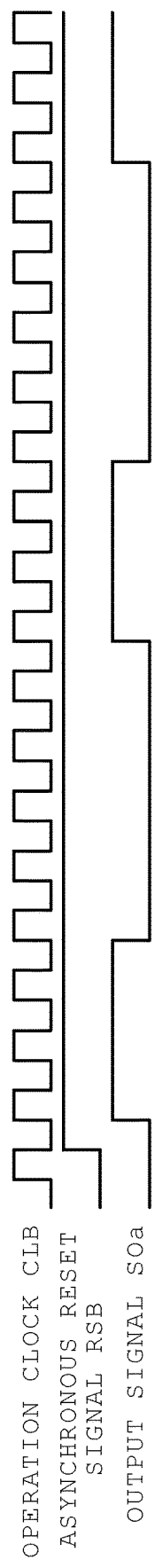
FIG. 11 is a waveform diagram of output signals and the like according to the second embodiment.

FIG. 11 is a diagram showing an example of waveforms of the output signal SOa and the like generated by the generation device 12a according to the second embodiment.

The generation device 12a can output the output signal SOa with a clock-like pattern that repeats a pattern in which 0's continue for L cycles and then 1's continue for M cycles. In the example shown in FIG. 11, the generation device 12a outputs an output signal SOa that repeats a pattern in which 1's continue for M cycles, 0's continue for L cycles and then 1's continue for M cycles. Specifically, in the example shown in FIG. 11, the generation device 12a outputs the output signal SOa that repeats a pattern in which 0's continue for 5 cycles and 1's continue for 3 cycles.

Figure 12:
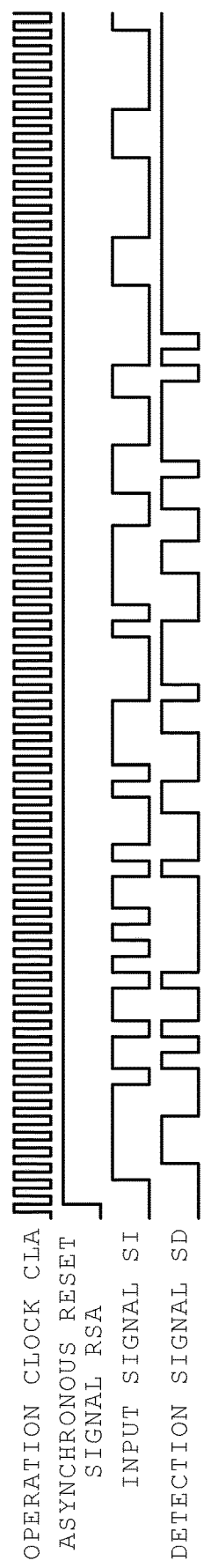
FIG. 12 is a waveform diagram of detection signals and the like according to the second embodiment.

FIG. 12 is a diagram showing an example of waveforms of the detection signal SD and the like generated by the determination device 18a according to the second embodiment.

The determination device 18a can output a detection signal SD that continuously is 1 in cycles in which the input signal SI matches a predetermined clock-like pattern, and is 0 in cycles in which the input signal SI does not match the predetermined clock-like pattern. In the example shown in FIG. 12, the determination device 18a outputs a detection signal SD that is continuously 1 if the input signal SI matches a clock-like pattern in which 0's continue for 5 cycles and 1's continue for 3 cycles, and is 0 if the input signal SI does not match the clock-like pattern.

Third Embodiment

A test system 10b according to a third embodiment has substantially the same function and configuration as the test system 10 according to the first embodiment. As for the test system 10b according to the third embodiment, devices, circuits, signals, and the like having substantially the same functions and configurations as those of the first embodiment are given the same names and reference numerals, and detailed description thereof will be omitted except for differences.

Figure 13:
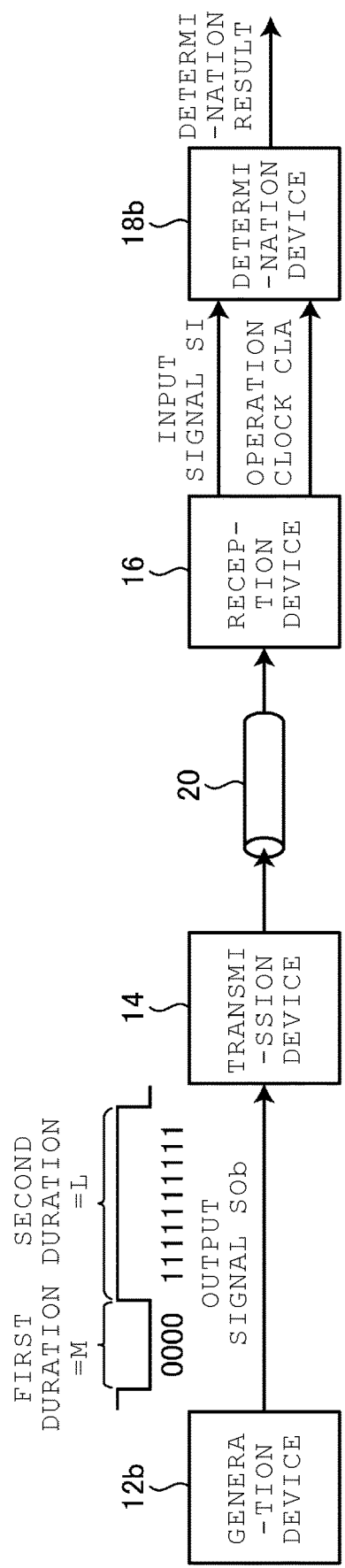
FIG. 13 is a configuration diagram of a test system according to a third embodiment.

FIG. 13 is a diagram showing a configuration of the test system 10b according to the third embodiment. The test system 10b includes a generation device 12b, the transmission device 14, the reception device 16, and a determination device 18b.

The generation device 12b generates an output signal SOb having a second duration longer than a first duration. The generation device 12b provides the generated output signal SOb to the transmission device 14. In the second embodiment, the first duration is M cycles and the second duration is L cycles. That is, in the third embodiment, the output signal SOb is a signal of a clock-like pattern that repeats a pattern in which 0's continue for M cycles and 1's continue for L cycles. Further, L>M.

The determination device 18b acquires the input signal SI and the operation clock CLA from the reception device 16. The determination device 18b determines in each clock cycle whether the input data in the input signal SI matches the output data in the output signal SOb. Then, the determination device 18b outputs a determination result indicating whether the input signal SI matches the output signal SOb.

The test system 10b can perform a transmission test with a clock-like pattern in which a duration of consecutive 1's is longer than a duration of consecutive 0's. Then, the test system 10b can also test error characteristics and the like caused by, for example, inter-symbol interference by performing the transmission test with the clock-like pattern in which the duration of consecutive 1's is longer than the duration of consecutive 0's.

Figure 14:
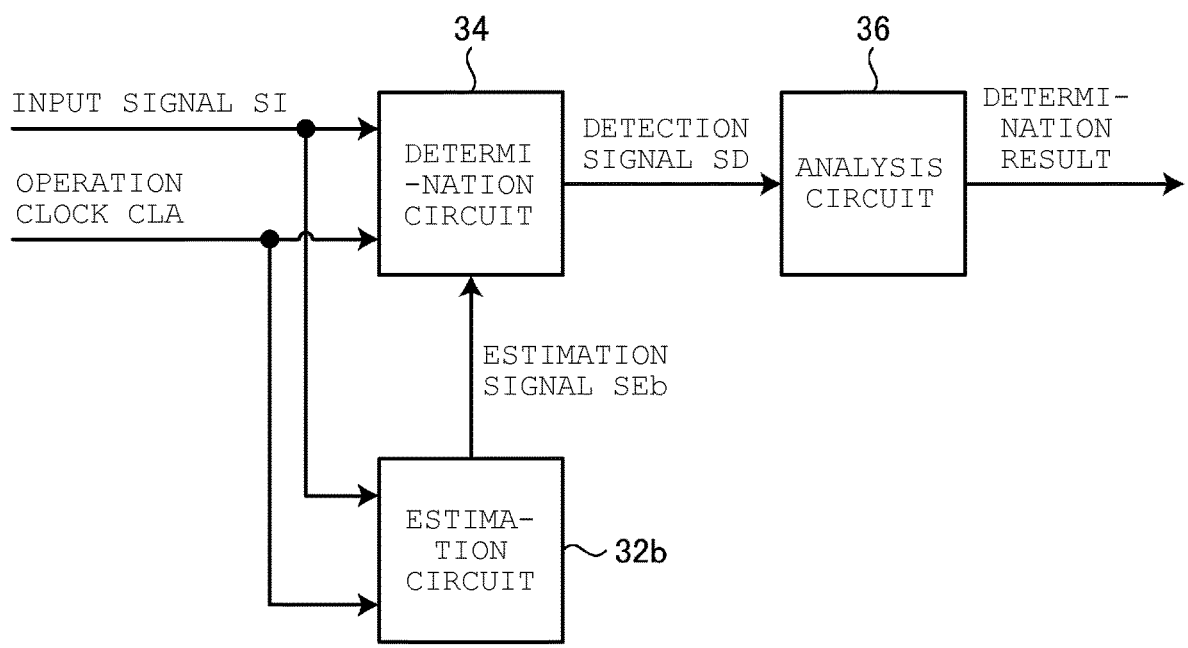
FIG. 14 is a configuration diagram of a determination device according to the third embodiment.

FIG. 14 is a diagram showing a configuration of the determination device 18b according to the third embodiment. The determination device 18b includes an estimation circuit 32b, the determination circuit 34, and the analysis circuit 36.

The estimation circuit 32b acquires the input signal SI and the operation clock CLA. The estimation circuit 32b generates an estimation signal SEb including estimation data in each clock cycle. The estimation circuit 32b generates the estimation data in each clock cycle based on the input signal SI, the operation clock CLA, and a predetermined fifth generator polynomial. The estimation circuit 32b provides in each clock cycle the estimation signal SEb including the estimation data to the determination circuit 34.

In the third embodiment, the number of cycles in the first duration is M and the number of cycles in the second duration is L. Therefore, in the third embodiment, the fifth generator polynomial is expressed by Equation (5).

[Equation 5]

$$y(n) = \begin{cases} \overline{x(n-1)}, & \sum_{k=1}^{L} x(n-k) = 0 \text{ or } \prod_{k=1}^{L} x(n-k) = 1 \\ x(n-1), & \sum_{k=1}^{L} x(n-k) \neq 0 \text{ and } \prod_{k=1}^{L} x(n-k) \neq 1 \end{cases} \quad (5)$$

The upper equation on the right side of Equation (5) expresses that y(n) is an inverted value of x(n−1) if the result of summing x(n−k) with varying k from 1 to M is 0 or the result of multiplying x(n−k) with varying k from 1 to L is 1. In addition, the lower expression on the right side of expression (5) expresses that y(n) is x(n−1) if the result of summing x(n−k) with varying k from 1 to M is not 0 and the result of multiplying x(n−k) with varying k from 1 to L is not 1.

According to Equation (5), as shown in the upper equation on the right side, y(n) is the inverted value of x(n−1) if 0's continue for M cycles or 1's continue for L cycles. According to Equation (5), as shown in the lower equation on the right side, y(n) is the value of x(n−1) if 0's do not continue for M cycles and 1's do not continue for L cycles. Therefore, by using the fifth generator polynomial shown in Equation (5), the estimation circuit 32b can generate estimation data that is estimated when the input signal SI has a clock-like pattern in which 0's continue for M cycles and 1's continue for L cycles based on the past input signal SI.

Figure 15:
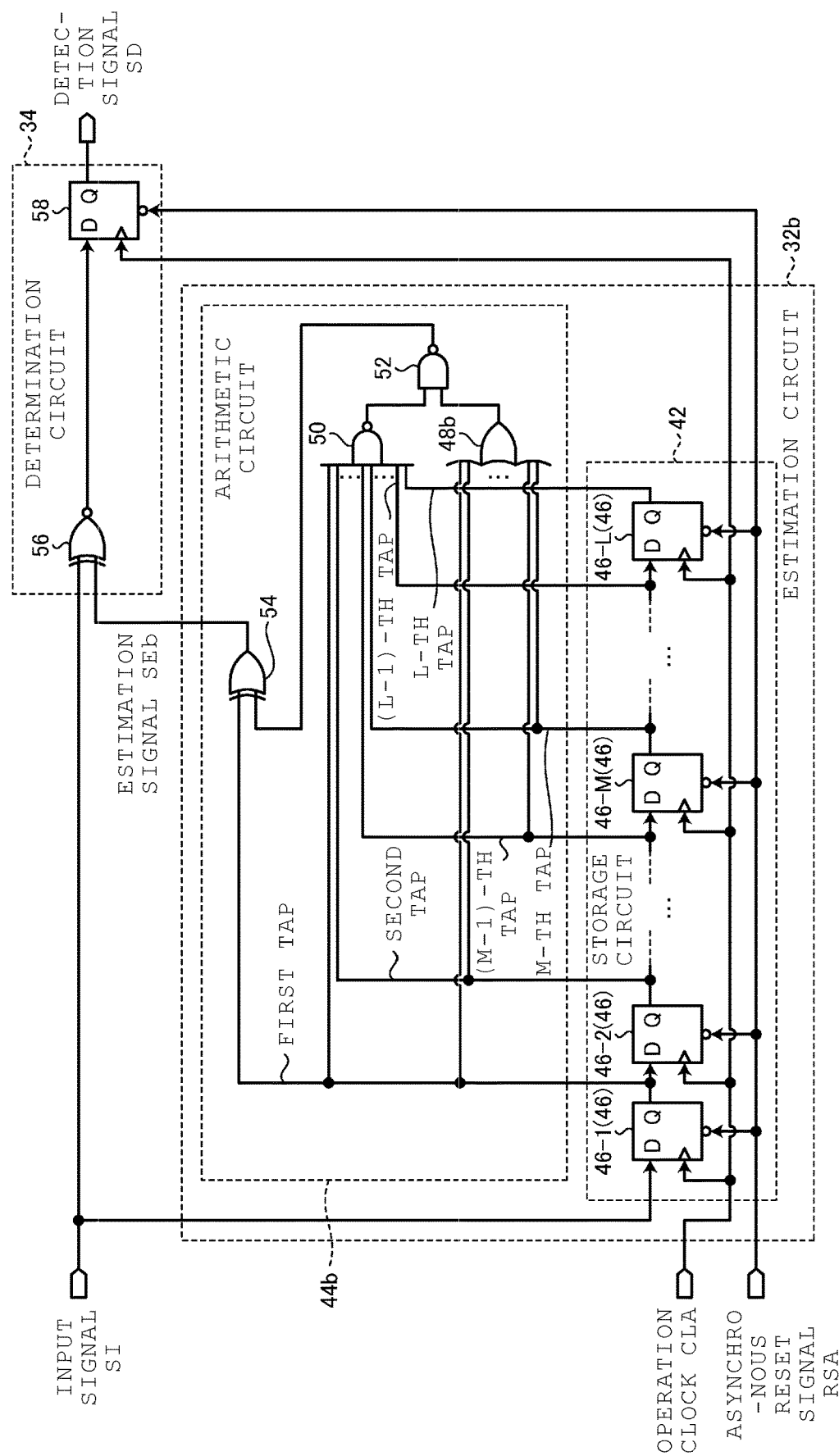
FIG. 15 is a configuration diagram of an estimation circuit and a determination circuit according to the third embodiment.

FIG. 15 is a diagram showing a configuration of the estimation circuit 32b and the determination circuit 34 according to the third embodiment. The estimation circuit 32b according to the third embodiment includes the storage circuit 42 and an arithmetic circuit 44b.

The arithmetic circuit 44b acquires (L) pieces of input data from (n−1)-th cycle to (n−L)-th cycle stored in the storage circuit 42 in the n-th cycle. In the n-th cycle, the arithmetic circuit 44b outputs an inverted value of the input data in the (n−1)-th cycle as the estimation data if a logical sum of all the input data from the (n−1)-th cycle to (n−M)-th cycle is 0 or a logical product of all the input data from the (n−1)-th cycle to the (n−L)-th cycle is 1. In addition, in the n-th cycle, the arithmetic circuit 44b outputs the same value as the input data in the (n−1)-th cycle as the estimation data if the logical sum of all the input data from the (n−1)-th cycle to the (n−M)-th cycle is not 0 and the logical product of all the input data from the (n−1)-th cycle to the (n−L)-th cycle is not 1.

For example, the arithmetic circuit 44b includes a first OR circuit 48b, the first NAND circuit 50, the second NAND circuit 52, and the first EX-OR circuit 54.

The first OR circuit 48b calculates the logical sum of all the input data stored in the storage circuit 42 from the (n−1)-th cycle to the (n−M)-th cycle. The first OR circuit 48b provides the calculated logical sum to the second NAND circuit 52. The second NAND circuit 52 performs a logical product operation on the logical sum calculated by the first OR circuit 48b and the inverted value of the logical product calculated by the first NAND circuit 50 so as to calculate an inverted value. The estimation circuit 32b having the above configuration outputs in each clock cycle the estimation data calculated by the arithmetic circuit 44b to the determination circuit 34.

The estimation circuit 32b having the configuration described above can generate in each clock cycle the estimation data by estimating the input data by performing the operation of the fifth generator polynomial shown in Equation (5).

Figure 16:
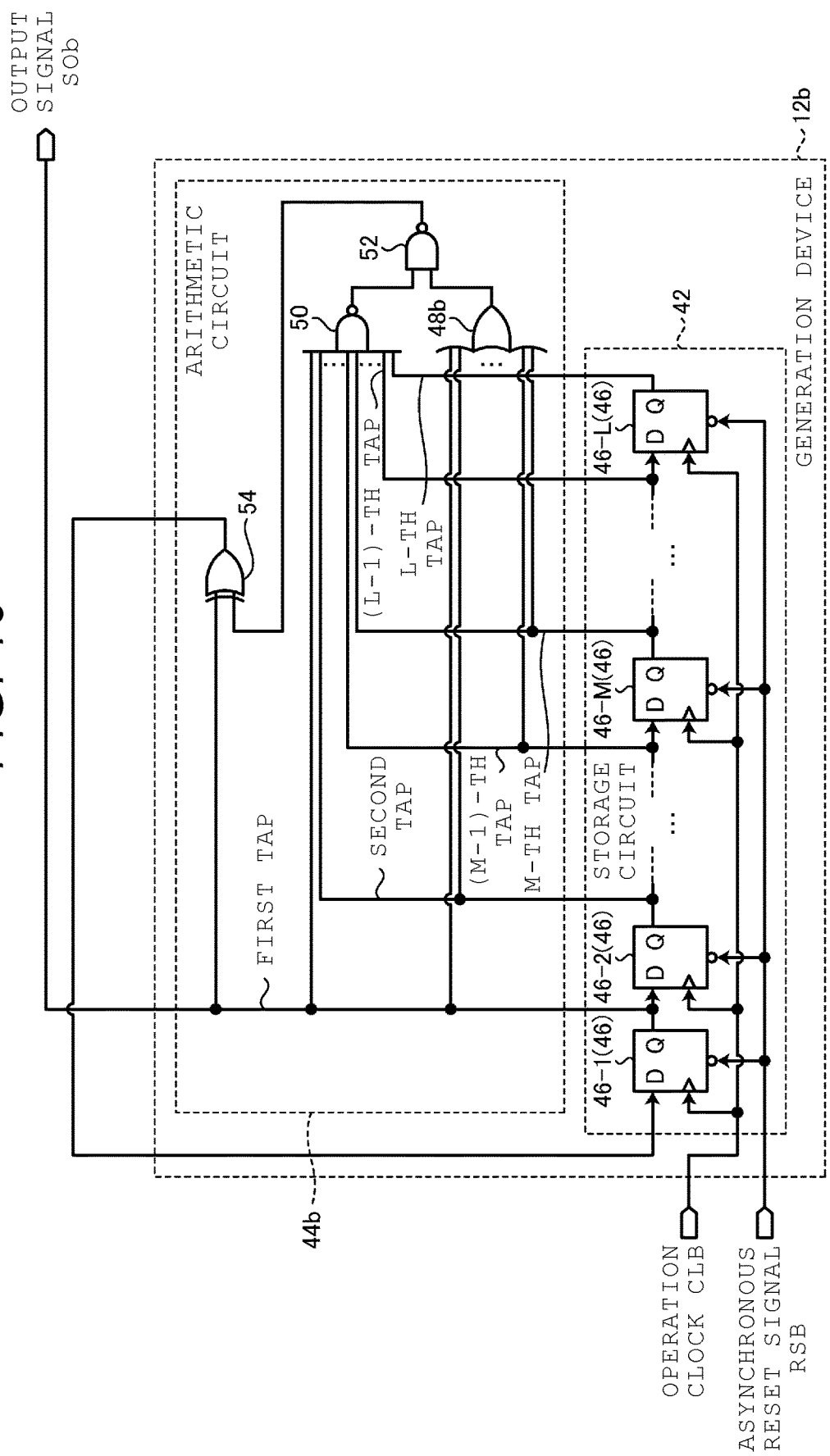
FIG. 16 is a configuration diagram of a generation device according to the third embodiment.

FIG. 16 is a diagram showing a configuration of the generation device 12b according to the third embodiment.

The generation device 12b according to the third embodiment generates output data in each clock cycle based on the operation clock CLB and a sixth generator polynomial. In the third embodiment, the number of cycles in the first duration is M and the number of cycles in the second duration is L. Therefore, in the third embodiment, the sixth generator polynomial is expressed by Equation (6).

[Equation 6]

$$z(n) = \begin{cases} \overline{z(n-1)}, & \sum_{k=1}^{L} z(n-k) = 0 \text{ or } \prod_{k=1}^{L} z(n-k) = 1 \\ z(n-1), & \sum_{k=1}^{L} z(n-k) \neq 0 \text{ and } \prod_{k=1}^{L} z(n-k) \neq 1 \end{cases} \quad (6)$$

The upper equation on the right side of Equation (6) expresses that z(n) is an inverted value of z(n−1) if the result of summing z(n−k) with varying k from 1 to M is 0 or the result of multiplying z(n−k) with varying k from 1 to L is 1. In addition, the lower expression on the right side of expression (6) expresses that z(n) is z(n−1) if the result of summing z(n−k) with varying k from 1 to M is not 0 and if the result of multiplying z(n−k) with varying k from 1 to L is not 1.

According to Equation (6), as shown in the upper equation on the right side, z(n) is the inverted value of z(n−1) if 0's continue for M cycles or 1's continue for L cycles. According to Equation (6), as shown in the lower equation on the right side, z(n) is the value of z(n−1) if 0's do not continue for M cycles and 1's do not continue for L cycles. Therefore, by using the sixth generator polynomial shown in Equation (6), the generation device 12b can generate the output signal SOb with a clock-like pattern that repeats a pattern in which 0's continue for M cycles and 1's continue for L cycles.

For example, when the generation device 12b according to the third embodiment generates the output signal SOb using the sixth generator polynomial, the generation device 12b includes the storage circuit 42 and the arithmetic circuit 44b.

The storage circuit 42 has the same configuration as the configuration of the storage circuit 42 shown in FIG. 15. However, in the n-th cycle, instead of acquiring the input data in the n-th cycle in the input signal SI, the storage circuit 42 provided in the generation device 12b acquires the data in the n-th cycle calculated by the arithmetic circuit 44b as the input data.

The arithmetic circuit 44b has the same configuration as that of arithmetic circuit 44b shown in FIG. 15. However, instead of outputting the estimation data to the determination circuit 34, the arithmetic circuit 44b provided in the generation device 12b feeds back the calculated data to the storage circuit 42.

Then, the generation device 12b outputs the output data stored in one of the (L) D flip-flops 46 in the storage circuit 42 in each clock cycle. In the example shown in FIG. 16, the generation device 12b outputs the output data stored in the first D flip-flop 46-1 in each clock cycle to generate the output signal SOb.

The generation device 12b having the configuration described above can generate in each clock cycle an output signal SOb with a clock-like pattern that alternately repeats a first duration in which 0's continue for M cycles and a second duration in which 1's continue for L cycles by performing the operation of the sixth generator polynomial expressed by Equation (6).

It is noted that, without using the sixth generator polynomial, the generation device 12b may count the operation clocks CLB with a counter so as to generate the output signal SOb that repeats a pattern in which 0's continue in the first duration and 1's continue in the second duration. In the third embodiment, since the first duration is M cycles and the second duration is L cycles, the generation device 12b generates an output signal SOb that repeats a pattern in which 0's are generated continuously for M cycles and 1's are generated continuously for L cycles by counting the operation clocks CLB.

Figure 17:
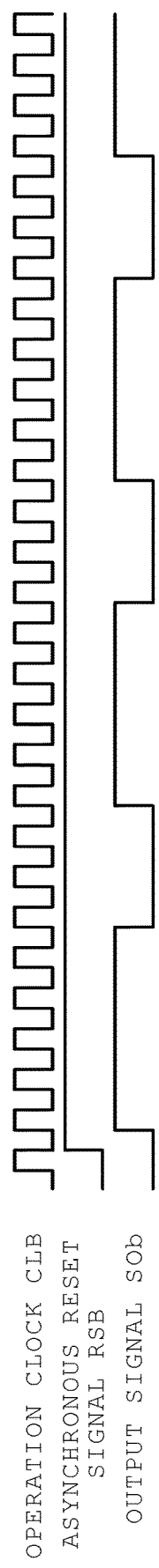
FIG. 17 is a waveform diagram of output signals and the like according to the third embodiment.

FIG. 17 is a diagram showing an example of waveforms of the output signal SOb and the like generated by the generation device 12b according to the third embodiment.

The generation device 12b can output the output signal SOb with a clock-like pattern that repeats a pattern in which 0's continue for M cycles and then 1's continue for L cycles.

In the example shown in FIG. 17, the generation device 12b outputs the output signal SOb that repeats a pattern in which 1's continue for L cycles, 0's continue for M cycles and then 1's continue for L cycles. Specifically, in the example shown in FIG. 17, the generation device 12b outputs the output signal SOb that repeats a pattern in which 0's continue for 3 cycles and 1's continue for 5 cycles.

Figure 18:
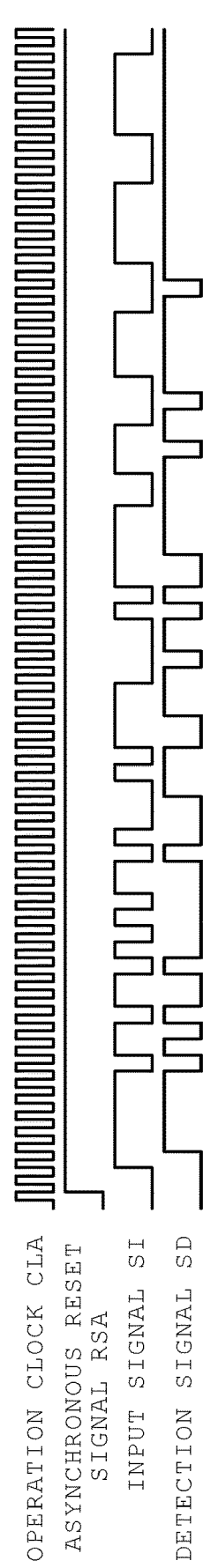
FIG. 18 is a waveform diagram of detection signals and the like according to the third embodiment.

FIG. 18 is a diagram showing an example of waveforms of the detection signal SD and the like generated by the determination device 18b according to the third embodiment.

The determination device 18b can output a detection signal SD that continuously is 1 in cycles in which the input signal SI matches a predetermined clock-like pattern, and is 0 in cycles in which the input signal SI does not match the predetermined clock-like pattern. In the example shown in FIG. 18, the determination device 18b outputs a detection signal SD that is continuously 1 if the input signal SI matches a clock-like pattern in which 0's continue for 3 cycles and 1's continue for 5 cycles, and is 0 if the input signal SI does not match the clock-like pattern.

Fourth Embodiment

A test system 10c according to a fourth embodiment has substantially the same function and configuration as the test system 10 according to the first embodiment. As for the test system 10c according to the fourth embodiment, devices, circuits, signals, and the like having substantially the same functions and configurations as those of the first embodiment are denoted by the same names and symbols, and detailed descriptions are omitted except for differences.

Figure 19:
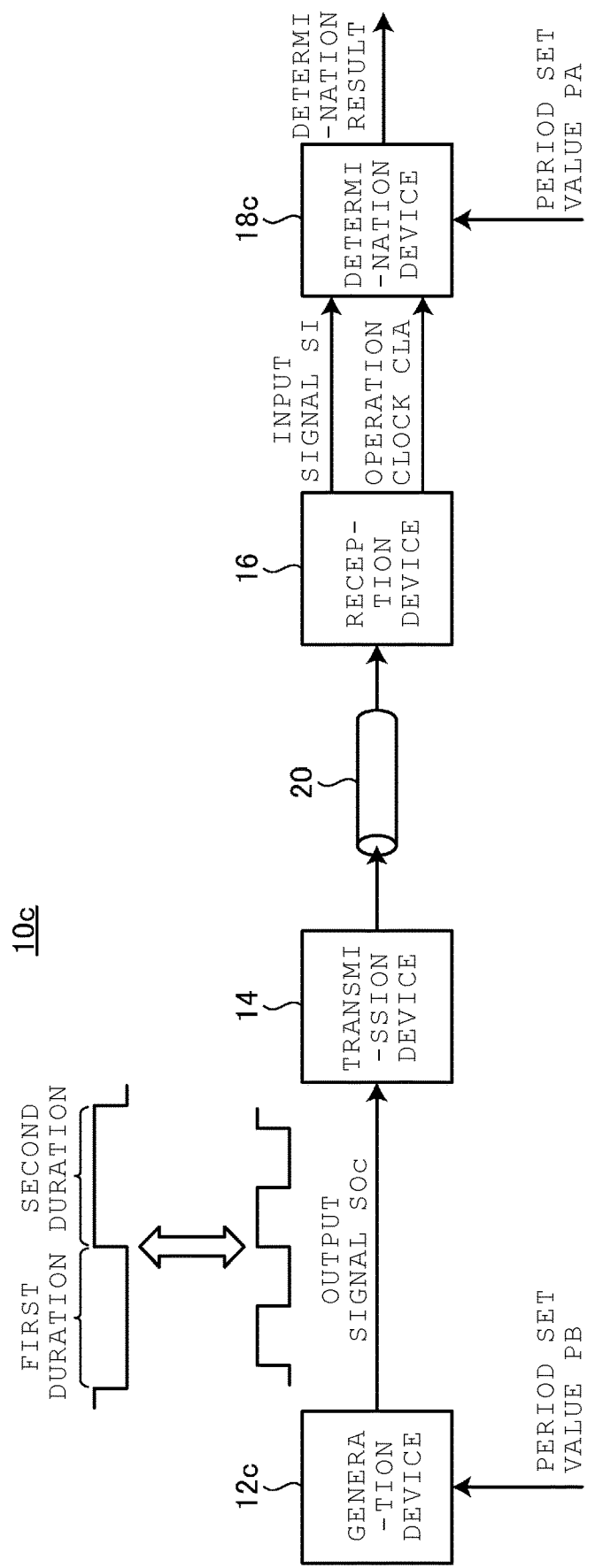
FIG. 19 is a configuration diagram of a test system according to a fourth embodiment.

FIG. 19 is a diagram showing a configuration of the test system 10c according to the fourth embodiment. The test system 10c according to the fourth embodiment includes a generation device 12c, the transmission device 14, the reception device 16, and a determination device 18c.

The generation device 12c generates an output signal SOc having a first duration and a second duration which are the same as each other. The generation device 12c provides the generated output signal SOc to the transmission device 14. In the fourth embodiment, the first duration is L cycles and the second duration is L cycles.

Further, the generation device 12c receives a period set value PB from a device that controls the generation device 12c, for example. The period set value PB is represented by a value obtained by subtracting 1 from the number of cycles in the first duration (or second duration), for example. The generation device 12c changes the first duration (and the second duration) of the output signal SOc according to the received period set value PB.

The determination device 18c acquires the input signal SI and the operation clock CLA from the reception device 16. The determination device 18c determines in each clock cycle whether the input data in the input signal SI matches the output data in the output signal SOc. Then, the determination device 18c outputs a determination result indicating whether the input signal SI matches the output signal SOc.

Further, the determination device 18c receives, from a device that controls the determination device 18c, for example, the same period set value PA as the period set value PB received by the generation device 12c. The determination device 18c changes the first duration and the second duration of the estimation signal SEc according to the received period set value PA. For example, the determination device 18c changes the first duration and the second duration in the first generator polynomial described above according to the period set value PA. More specifically, the determination device 18c changes the value of L (the number of cycles) in the first generator polynomial shown in Equation (1) in accordance with the period set value PA.

The test system 10c can perform a transmission test with a clock-like pattern having the same first duration and the same second duration by changing the periods of the clock-like pattern.

Figure 20:
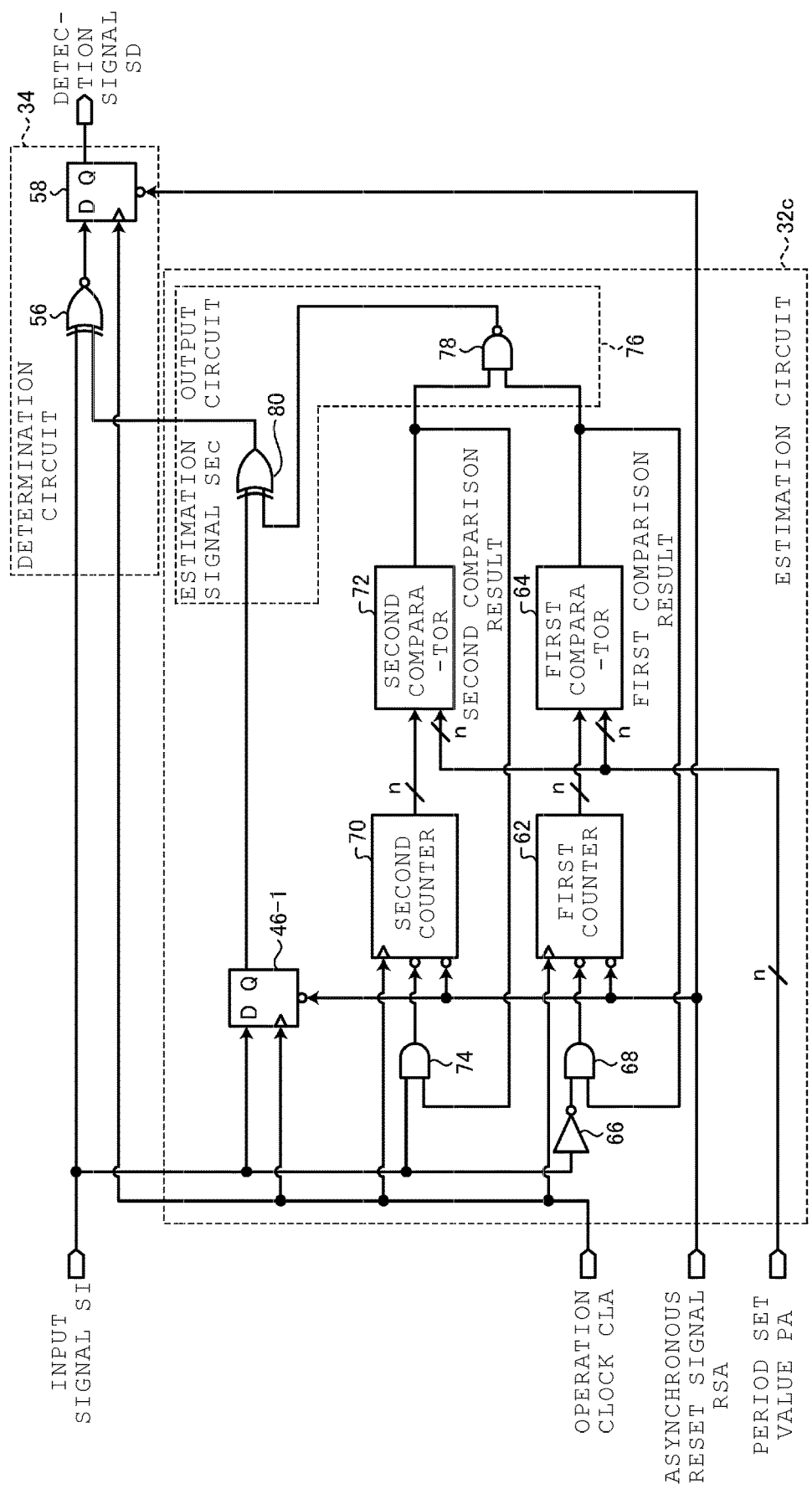
FIG. 20 is a configuration diagram of an estimation circuit and a determination circuit according to the fourth embodiment.

FIG. 20 is a diagram showing a configuration of the estimation circuit 32c and the determination circuit 34 according to the fourth embodiment. As compared with the determination device 18 according to the first embodiment, the determination device 18c according to the fourth embodiment includes the estimation circuit 32c shown in FIG. 20 instead of the estimation circuit 32.

The estimation circuit 32c includes a first counter 62, a first comparator 64, a first inverting circuit 66, a first AND circuit 68, a second counter 70, a second comparator 72, a second AND circuit 74, the first D flip-flop 46-1, and the output circuit 76.

The first counter 62 receives the operation clock CLA through the clock terminal. The first counter 62 stores a first count value of n-bit width (n is a predetermined integer). n is the number of bits that can represent at least the maximum value of the first duration (and the second duration) in binary. The first counter 62 counts up the first count value by a predetermined value each time the operation clock CLA is received. In the present embodiment, the first counter 62 increments the first count value by 1 each time the operation clock CLA is received.

The first counter 62 receives an asynchronous reset signal RSA through the first reset terminal. If the asynchronous reset signal RSA is 0, the first counter 62 resets the first count value to a predetermined value, e.g., to 0.

The first counter 62 receives the first synchronous reset signal output from the first AND circuit 68 through the second reset terminal. If the first synchronous reset signal is 0, the first counter 62 in synchronization with the operation clock CLA resets the first count value to a predetermined value, e.g., to 0.

If both the first reset terminal and the second reset terminal are 1, the first counter 62 updates (increments) the stored content in synchronization with the operation clock CLA.

The first comparator 64 acquires the period set value PA and the first count value output from the first counter 62. Each of the period set value PA and the first count value is an integer of 1 or more represented by an n-bit width. The first comparator 64 outputs a first comparison result represented by 0 or 1. The first comparator 64 outputs 0 as the first comparison result if the first count value and the period set value PA match, and outputs 1 as the first comparison result if the first count value and the period set value PA do not match.

That is, the first comparator 64 outputs 0 as the first comparison result if the first count value is a value representing the first duration. In addition, the first comparator 64 outputs 1 as the first comparison result if the first count value is other than the value representing the first duration. In the present embodiment, the first comparator 64 outputs 0 as the first comparison result if the first count value is L, and outputs 1 as the first comparison result if the first count value is other than L.

The first inverting circuit 66 inverts the input signal SI and outputs the inverted input signal SI.

The first AND circuit 68 receives the input signal SI inverted by the first inverting circuit 66 and the first comparison result output from the first comparator 64. The first AND circuit 68 outputs 1 as the first synchronous reset signal if an inverted value of the input data is 1 and the first comparison result is 1, and outputs 0 as the first synchronous reset signal if at least one of the inverted value of the input data and the first comparison result is 0.

The first counter 62 counts up the first count value in each clock cycle. Then, the first counter 62 resets the first count value to a predetermined value (e.g., 0) if the input signal SI includes 1 or the first count value is a value representing the first duration. As a result, in the n-th cycle, the first counter 62 can store, as the first count value, a value representing the number of consecutive 0's during the duration immediately before the n-th cycle.

In addition, the first comparator 64 can output 0 as the first comparison result if the input signal SI includes consecutive 0's for the number of cycles corresponding to the first duration in the n-th cycle. Further, the first comparator 64 can output 1 as the first comparison result if the input signal SI does not include consecutive 0's for the number of cycles corresponding to the first duration in the n-th cycle. As a result, the first comparator 64 can output 0 as the first comparison result if a logical sum of all the input data in the first duration is 0, and can output 1 as the first comparison result if a logical sum of all the input data in the first duration is not 0.

The second counter 70 receives the operation clock CLA through the clock terminal. The second counter 70 stores an n-bit width second count value. The second counter 70 counts up the second count value by a predetermined value each time the operation clock CLA is received. In the present embodiment, the second counter 70 increments the second count value by 1 each time the operation clock CLA is received.

The second counter 70 receives the asynchronous reset signal RSA through the first reset terminal. If the asynchronous reset signal RSA is 0, the second counter 70 resets the second count value to a predetermined value, e.g., to 0.

The second counter 70 receives a second synchronous reset signal output from the second AND circuit 74 through the second reset terminal. If the second synchronous reset signal is 0, the second counter 70 in synchronization with the operation clock CLA resets the second count value to a predetermined value, e.g., to 0.

When both the first reset terminal and the second reset terminal are 1, the second counter 70 updates (increments) the stored content in synchronization with the operation clock CLA.

The second comparator 72 acquires the period set value PA and the second count value output from the second counter 70. Each of the period set value PA and the second count value is an integer of 1 or more represented by an n-bit width. The second comparator 72 outputs a second comparison result represented by 0 or 1. The second comparator 72 outputs 0 as the second comparison result if the second count value and the period set value PA match, and outputs 1 as the second comparison result if the second count value and the period set value PA do not match.

That is, the second comparator 72 outputs 0 as the second comparison result if the second count value is a value representing the second duration. Further, the second comparator 72 outputs 1 as the second comparison result if the second count value is other than the value representing the second duration. In the present embodiment, the second comparator 72 outputs 0 as the second comparison result if the second count value is L, and outputs 1 as the second comparison result if the second count value is other than L.

The second AND circuit 74 receives the input signal SI and the second comparison result output from the second comparator 72. The second AND circuit 74 outputs 1 as the second synchronous reset signal if the input data is 1 and the second comparison result is 1, and outputs 0 as the second synchronous reset signal if at least one of the input data and the second comparison result is 0.

The second counter 70 counts up the second count value in each clock cycle. Then, the second counter 70 resets the second count value to a predetermined value (e.g., 0) if the input signal SI includes 0 or the second count value is a value representing the second duration. As a result, in the n-th cycle, the second counter 70 can store, as the second count value, a value representing the number of consecutive 1's during the duration immediately before the n-th cycle.

Further, the second comparator 72 can output 0 as the second comparison result if the input signal SI includes consecutive 1's for the number of cycles corresponding to the second duration in the n-th cycle. In addition, the second comparator 72 can output 1 as the second comparison result if the input signal SI does not include consecutive 1's for the number of cycles corresponding to the second duration in the n-th cycle. As a result, the second comparator 72 can output 0 as the second comparison result if the logical product of all input data in the second duration is 1, and output 1 as the second comparison result if the logical product of all input data in the second duration is not 1.

The first D flip-flop 46-1 receives the operation clock CLA through the clock terminal. The first D flip-flop 46-1 acquires the input data in the input signal SI through the D terminal. The first D flip-flop 46-1 acquires the data input through the D terminal at the timing of the operation clock CLA and stores the acquired data. The first D flip-flop 46-1 outputs the stored data through the Q terminal according to the operation clock CLA.

A reset signal is received through the reset terminal of the first D flip-flop 46-1 at the timing of starting operation, for example. The first D flip-flop 46-1 resets the stored data to a predetermined value of either 1 or 0 if the reset signal is 0. The first D flip-flop 46-1 can output the input data in (n−1)-th cycle through the Q terminal in the n-th cycle.

The output circuit 76 acquires input data in the (n−1)-th cycle from the first D flip-flop 46-1 in the n-th cycle. The output circuit 76 also acquires the first comparison result from the first comparator 64 and the second comparison result from the second comparator 72. Then, the output circuit 76 outputs in each clock cycle the inverted value of the input data in the (n−1)-th cycle as the estimation data in the n-th cycle if the first count value is a value representing the first duration or the second count value is a value representing the second duration. In addition, the output circuit 76 outputs in each clock cycle the same value as the input data in the (n−1)-th cycle as the estimation data in the n-th cycle if the first count value is not a value representing the first duration and the second count value is not a value representing the second duration.

For example, the output circuit 76 includes a third NAND circuit 78 and a second EX-OR circuit 80.

The third NAND circuit 78 performs a logical product operation on the first comparison result output from the first comparator 64 and the second comparison result output from the second comparator 72 so as to calculate an inverted value of the result. Therefore, in the n-th cycle, the third NAND circuit 78 outputs 1 if the logical sum of all the input data from the (n−1)-th cycle to (n−L)-th cycle is 0 or the logical product of all the input data from the (n−1)-th cycle to the (n−L)-th cycle is 1. In addition, in the n-th cycle, the third NAND circuit 78 outputs 0 if the logical sum of all the input data from the (n−1)-th cycle to the (n−L)-th cycle is not 0 and the logical product of all the input data from the (n−1)-th cycle to the (n−L)-th cycle is not 1.

The second EX-OR circuit 80 acquires the data calculated by the third NAND circuit 78. Further, the second EX-OR circuit 80 acquires the data through the Q terminal of the first D flip-flop 46-1. The second EX-OR circuit 80 outputs the exclusive OR of the acquired two pieces of data as the estimation data. That is, in the n-th cycle, if 1 is output from the third NAND circuit 78, the second EX-OR circuit 80 outputs the inverted value of the input data in the (n−1)-th cycle as the estimation data. In addition, in the n-th cycle, if 0 is output from the third NAND circuit 78, the second EX-OR circuit 80 outputs the same value as the input data in the (n−1)-th cycle as the estimation data.

In the n-th cycle, the estimation circuit 32c having the above configuration can output the inverted value of the input data in the (n−1)-th cycle as the estimation data if the logical sum of all the input data from the (n−1)-th cycle to the (n−L)-th cycle is 0 or the logical product of all the input data from the (n−1)-th cycle to the (n−L)-th cycle is 1. In addition, in the n-th cycle, the estimation circuit 32c can output the same value as the input data in the (n−1)-th cycle as the estimation data if the logical sum of all the input data from the (n−1)-th cycle to the (n−L)-th cycle is not 0 and the logical product of all the input data from the (n−1)-th cycle to the (n−L)-th cycle is not 1.

Then, the estimation circuit 32c outputs in each clock cycle the estimation signal SEc including the calculated estimation data to the determination circuit 34.

The estimation circuit 32c having the configuration described above can generate in each clock cycle the estimation data by estimating the input data by performing the operation of the first generator polynomial shown in Equation (1). Furthermore, the estimation circuit 32c can change a period of the input signal SI to be detected according to the period set value PA.

The period set value PA is ½ of the number of cycles in the period of the output signal SOc. Therefore, for example, the period set value PA is 1 if the period is 2 cycles, 2 if the period is 4 cycles, and L if the period is 2L cycles.

Figure 21:
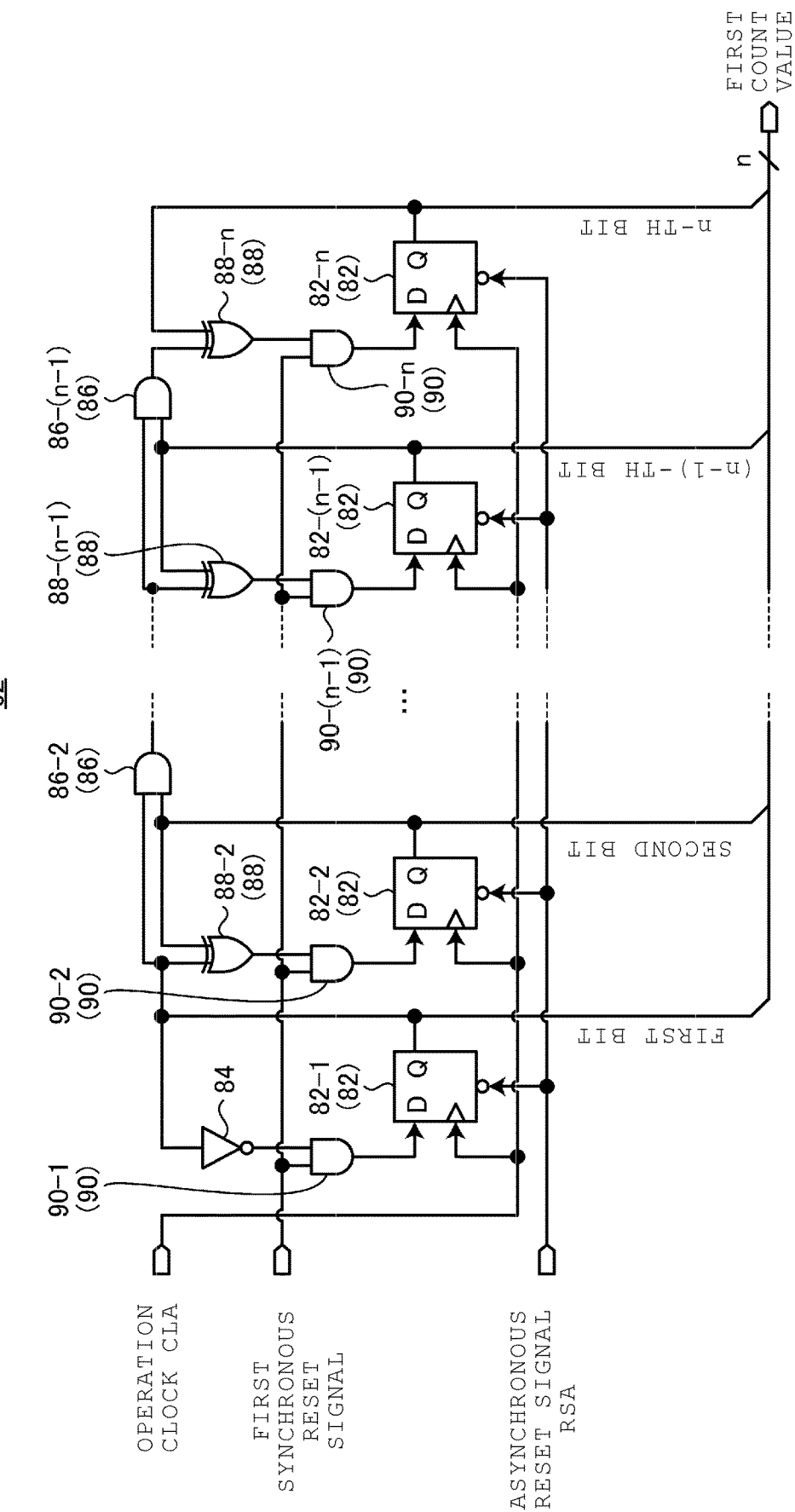
FIG. 21 is a configuration diagram of a first counter.

FIG. 21 is a diagram showing an example of a configuration of the first counter 62. The first counter 62 is configured as shown in FIG. 21, for example.

For example, the first counter 62 includes (n) counter D flip-flops 82 (82-1 to 82-n), a second inverter circuit 84, (n−2) third AND circuits 86 (86-2 to 86-(n−1)), (n−1) third EX-OR circuits 88 (88-2 to 88-n), and (n) fourth AND circuits 90 (90-1 to 90-n).

Each of the (n) counter D flip-flops 82 receives the operation clock CLA through the clock terminal. Each of the (n) counter D flip-flops 82 acquires and stores the data input through the D terminal at the timing of the operation clock CLA. Each of the (n) counter D flip-flops 82 outputs the stored data through the Q terminal according to the operation clock CLA.

Each of the (n) counter D flip-flops 82 receives the asynchronous reset signal RSA through the reset terminal at the timing of starting operation, for example. Each of the (n) counter D flip-flops 82 resets the stored data to 0 if the asynchronous reset signal RSA is 0.

The (n) counter D flip-flops 82 correspond to n-bits from the first bit to the n-th bit in the first count value represented by a binary number. The counter D flip-flop 82-j which corresponds to the j-th bit (j is any integer from 1 to n) of the (n) counter D flip-flops 82 acquires a value output from a fourth AND circuit 90-j corresponding to the j-th bit of the (n) fourth AND circuits 90 through the D terminal.

The second inverter circuit 84 corresponds to the first bit of the n-bits. The second inverting circuit 84 outputs the inverted value of the data output through the Q terminal of the counter D flip-flop 82-1 corresponding to the first bit of the (n) counter D flip-flops 82.

The (n−2) third AND circuits 86 correspond to the second bit to the (n−1)-th bit of the n-bits. The third AND circuit 86-2 corresponding to the second bit third AND circuits 86 outputs the result of the AND operation on the data output through the Q terminal of the counter D flip-flop 82-1 corresponding to the first bit and the data output through the Q terminal of the counter D flip-flop 82-2 corresponding to the second bit. The third AND circuit 86-k corresponding to the k-th bit (k is any integer from 3 to (n−1)) of the (n−2) third AND circuits 86 outputs the result of the AND operation on the data output of the AND circuit 86-(k−b 1) corresponding to the (k−1)-th bit and the data output through the Q terminal of the counter D flip-flop 82-k corresponding to the k-th bit.

The (n−1) third EX-OR circuits 88 correspond to the second bit to the n-th bit of the n-bits. The third EX-OR circuit 88-2 which corresponds to the second bit of the (n−1) third EX-OR circuits 88 outputs the result of the exclusive OR operation on the data output through the Q terminal of the counter D flip-flop 82-1 corresponding to the first bit and the data output through the Q terminal of a counter D flip-flop 82-2 corresponding to the second bit. The third EX-OR circuit 88-p which corresponds to the p-th bit (p is any integer from 3 to n) of the (n−1) third EX-OR circuits 88 outputs the result of the exclusive OR operation on the data output from the third AND circuit 86-(p−1) corresponding to the (p−1)th bit and the data output through the Q terminal of a counter D flip-flop 82-p corresponding to the p-th bit.

The (n) fourth AND circuits 90 correspond to the first bit to the n-th bit of the n-bits. The fourth AND circuit 90-1 which corresponds to the first bit of the (n) fourth AND circuits 90 outputs the result of logical product operation on the first synchronous reset signal output from the first AND circuit 68 and the data output from the second inverter circuit 84. The fourth AND circuit 90-r which corresponds to the r-th bit (r is any integer from 2 to n) of the (n) fourth AND circuits 90 outputs the result of logical product operation on the first synchronous reset signal and the data output from a third EX-OR circuit 88-r corresponding to the r-th bit.

Then, the first counter 62 outputs the data stored in each of the (n) counter D flip-flops 82 as the value of the corresponding bit in the first count value.

The first counter 62 can store a first count value represented by an n-bit binary number into the (n) counter D flip-flops 82, and increment the first count value by 1 in each clock cycle. Furthermore, the first counter 62 can reset the first count value to 0 if the first synchronous reset signal is 0.

The second counter 70 acquires the second synchronous reset signal output from the second AND circuit 74, instead of the first synchronous reset signal output from the first AND circuit 68. In addition, the second counter 70 outputs a second count value instead of the first count value. The second counter 70 differs from the first counter 62 in view of the aspects described above, but has the same configuration as the first counter 62 in other aspects.

Figure 22:
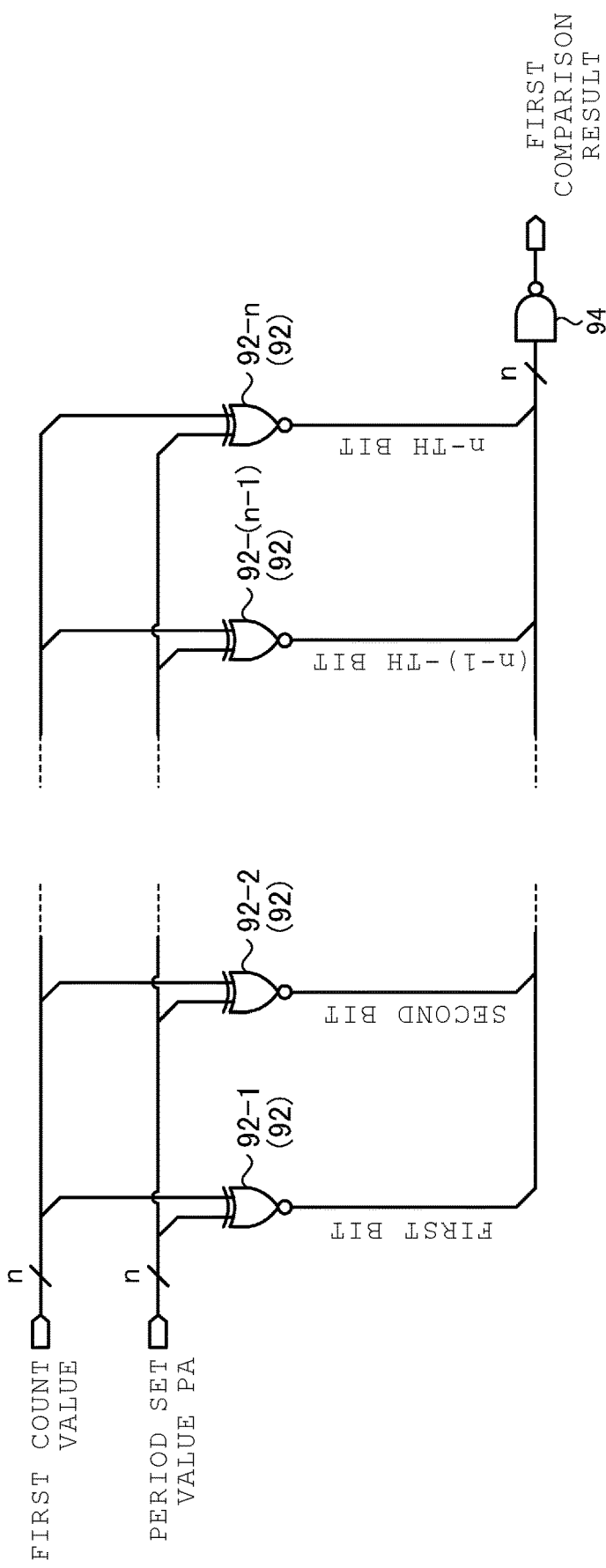
FIG. 22 is a configuration diagram of a first comparator.

FIG. 22 is a diagram showing an example of a configuration of the first comparator 64. The first comparator 64 is configured as shown in FIG. 22, for example.

For example, the first comparator 64 includes (n) second EX-NOR circuits 92 and a fourth NAND circuit 94.

The (n) second EX-NOR circuits 92 correspond to the first bit to the n-th bit of the n-bits. The second EX-NOR circuit 92-$j$ which corresponds to the j-th bit of the (n) second EX-NOR circuits 92 acquires the j-th bit value of the first count value output from the first counter 62 and the j-th bit value of the period set value PA. The second EX-NOR circuit 92-$j$ corresponding to the j-th bit outputs 1 if the acquired two pieces of data match, and outputs 0 if the acquired two pieces of data do not match.

The fourth NAND circuit 94 performs a logical product operation on all the data output from the (n) second EX-NOR circuits 92 and outputs the inverted value of the result as the first comparison result. The first comparator 64 having the configuration described above can output a first comparison result representing 0 if the first counter value and the period set value PA match, and 1 if the values do not match.

In addition, the second comparator 72 acquires the second count value output from the second counter 70, instead of the first count value output from a first counter 62. In addition, the second comparator 72 outputs the second comparison result instead of the first comparison result. The second comparator 72 differs from the first comparator 64 in view of the aspects described above, but has the same configuration as the first comparator 64 in other aspects.

Figure 23:
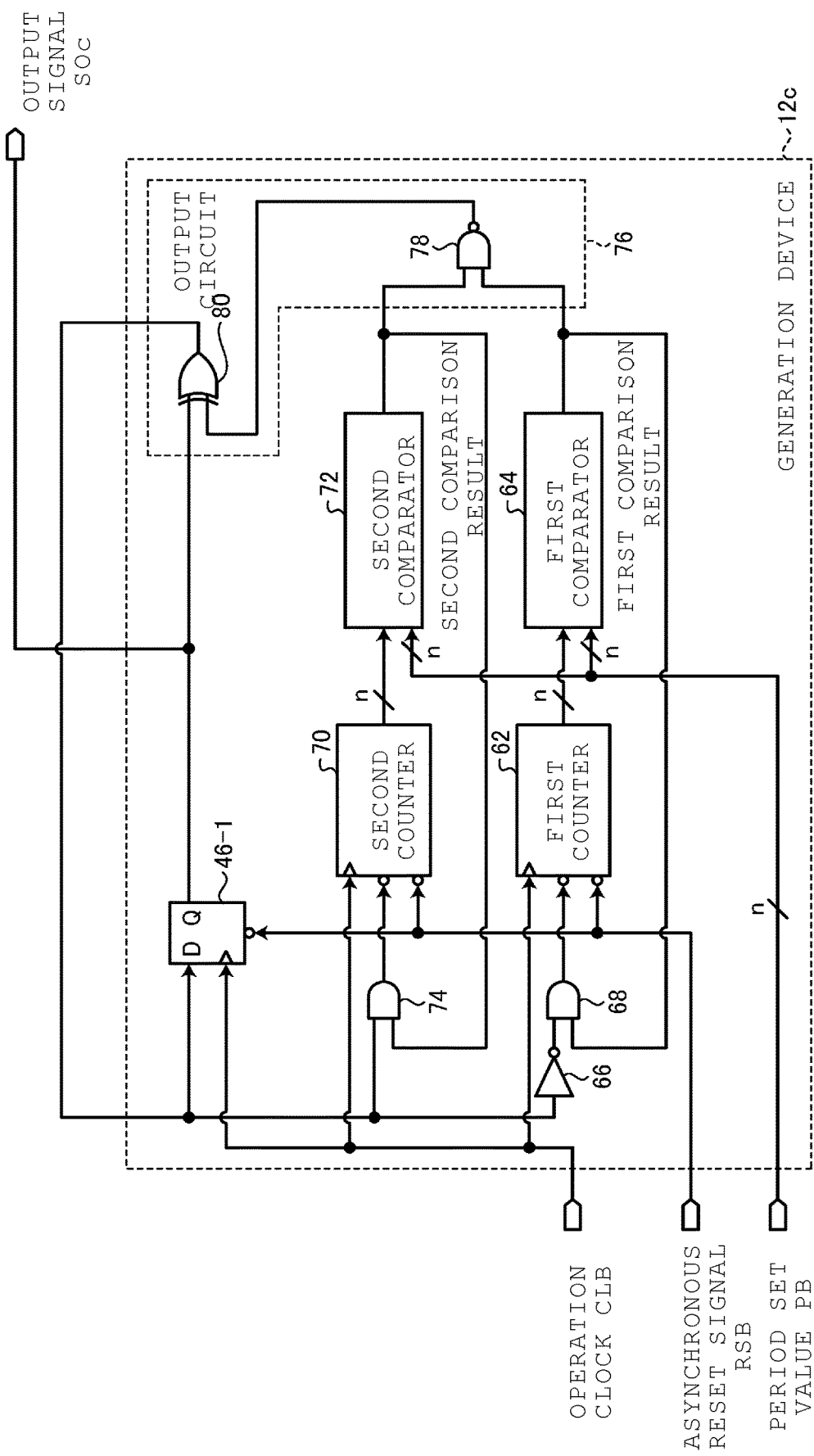
FIG. 23 is a configuration diagram of a generation device according to the fourth embodiment.

FIG. 23 is a diagram showing a configuration of the generation device 12$c$ according to the fourth embodiment.

The generation device 12$c$ according to the fourth embodiment has substantially the same configuration as the configuration of the estimation circuit 32$c$ shown in FIG. 20. However, in the n-th cycle, instead of acquiring the input data in the n-th cycle in the input signal SI, the generation device 12$c$ acquires the data in the n-th cycle generated by the generation device 12$c$ as the input data. That is, instead of outputting the estimation data to the determination circuit 34 in the n-th cycle, the generation device 12$c$ feeds back the generated data to itself. Then, the generation device 12$c$ outputs the output data stored in the first D flip-flop 46-1 in each clock cycle to generate the output signal SOc.

The generation device 12$c$ having the configuration described above can generate in each clock cycle an output signal SOc with a clock-like pattern that alternately repeats a first duration in which 0's continue for L cycles and a second duration in which 1's continue for L cycles by performing the operation of the second generator polynomial expressed by Equation (2). It is noted that, without using the second generator polynomial, the generation device 12$c$ may count the operation clocks CLB with a counter so as to generate the output signal SOc that repeats a pattern in which 0's continue in the first duration and 1's continue in the second duration.

Figure 24:
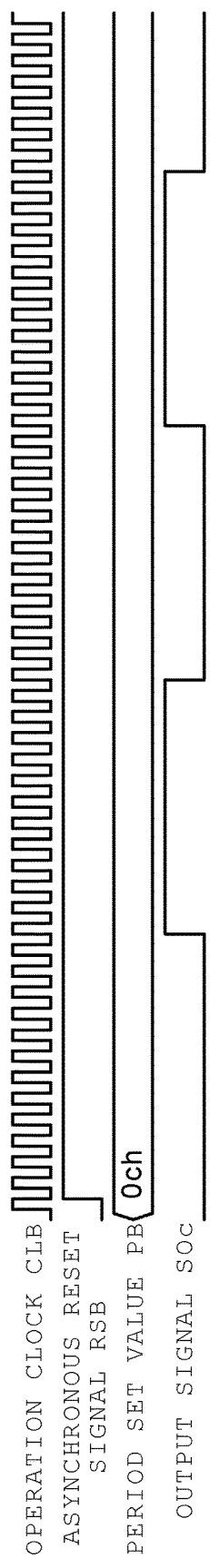
FIG. 24 is a waveform diagram of output signals and the like according to the fourth embodiment.

FIG. 24 is a diagram showing an example of waveforms of the output signal SOc and the like generated by the generation device 12$c$ according to the fourth embodiment.

The generation device 12$c$ receives the period set value PB. According to the received period set value PB, the generation device 12$c$ can output an output signal SOc with a clock-like pattern that repeats a pattern in which 0's continue for L cycles and then 1's continue for L cycles. In the example shown in FIG. 24, the generation device 12$c$ receives hexadecimal "0ch" as the period set value PB. In addition, in the example shown in FIG. 24, the generation device 12$c$ outputs the output signal SOc that repeats a pattern in which 0's continue for 12 cycles and 1's continue for 12 cycles.

Figure 25:
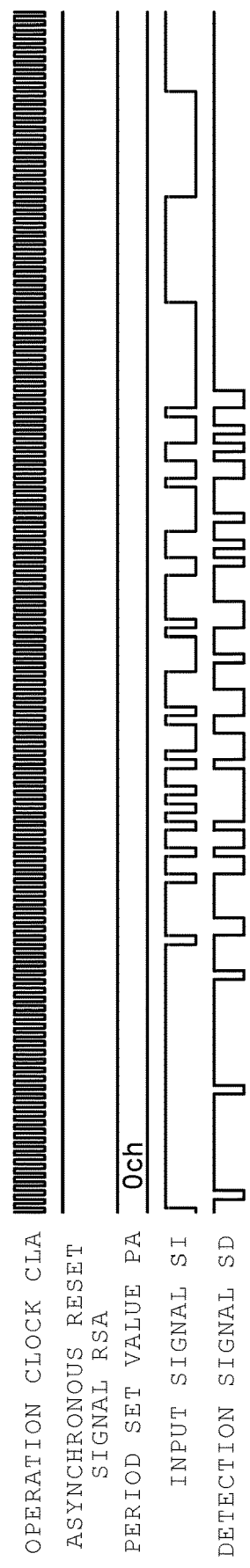
FIG. 25 is a waveform diagram of detection signals and the like according to the fourth embodiment.

FIG. 25 is a diagram showing an example of waveforms of the detection signal SD and the like generated by the determination device 18$c$ according to the fourth embodiment.

The determination device 18$c$ receives the period set value PA. The determination device 18$c$ can output a detection signal SD that continuously is 1 in cycles in which the input signal SI matches a clock-like pattern corresponding to the received period set value PA, and is 0 in cycles in which the input signal SI does not match the clock-like pattern. In the example shown in FIG. 25, the determination device 18$c$ receives the hexadecimal "0ch" as the period set value PA. In the example shown in FIG. 25, a detection signal SD is output, which is 1 if the input signal SI matches the clock-like pattern in which 0's continue for 12 cycles and 1's continue for 12 cycles and is 0 if the input signal SI does not match the clock-like pattern.

Fifth Embodiment

A test system 10$d$ according to a fifth embodiment has substantially the same function and configuration as the test system 10$c$ according to the fourth embodiment. As for the test system 10$d$ according to the fifth embodiment, devices, circuits, signals, and the like having substantially the same functions and configurations as those of the fourth embodiment are given the same names and reference numerals, and detailed description thereof will be omitted except for differences.

Figure 26:
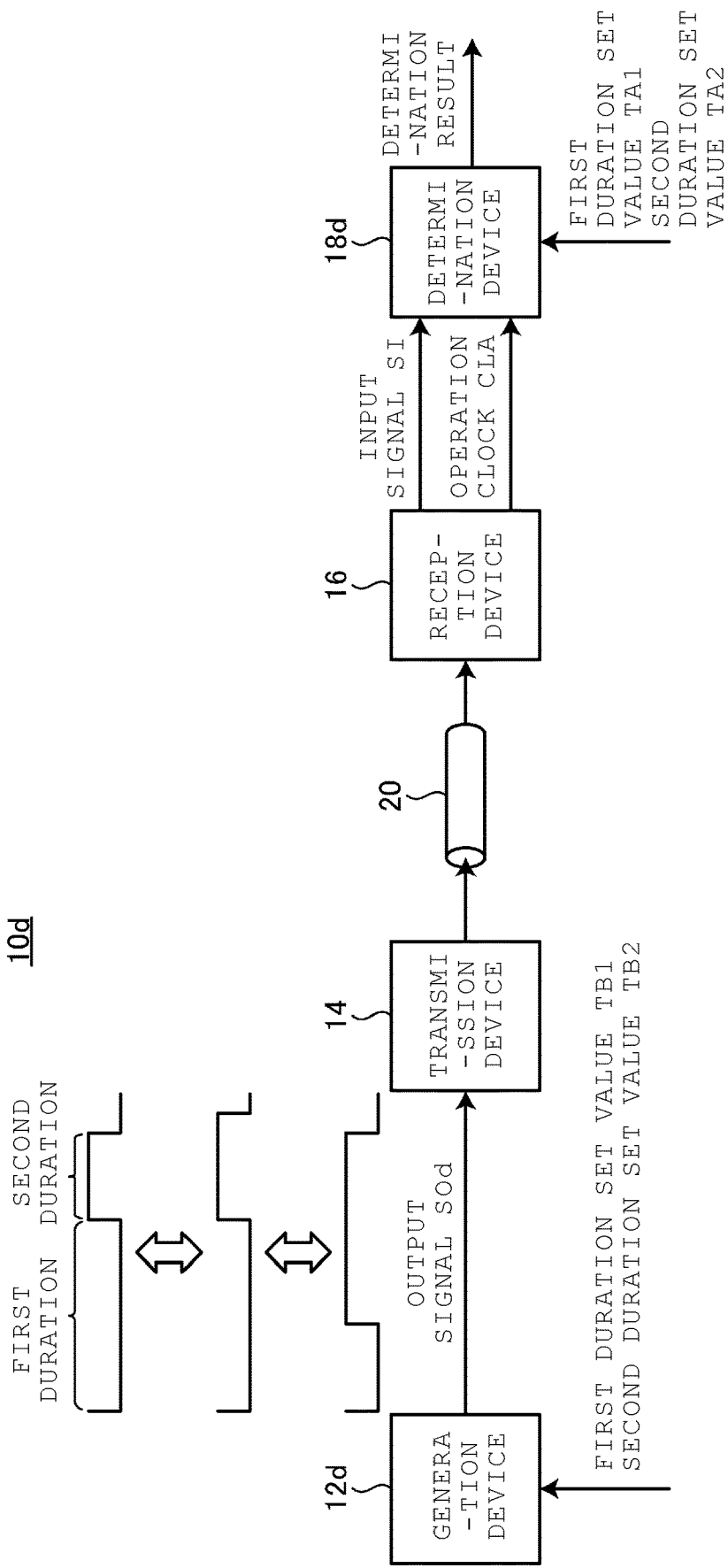
FIG. 26 is a configuration diagram of a test system according to a fifth embodiment.

FIG. 26 is a diagram showing a configuration of the test system 10$d$ according to the fifth embodiment. The test system 10$d$ according to the fifth embodiment includes a generation device 12$d$, the transmission device 14, the reception device 16, and a determination device 18$d$.

The generation device 12$d$ generates an output signal SOd in which first and second durations are different from each other. The generation device 12$d$ provides the generated output signal SOd to the transmission device 14.

For example, the first duration corresponds to L cycles and the second duration corresponds to M cycles. In this case, the output signal SOd is a clock-like pattern signal that repeats a pattern in which 0's continue for L cycles and 1's continue for M cycles.

In addition, the first duration may correspond to M cycles, and the second duration may correspond to L cycles. In this case, the output signal SOd is a clock-like pattern signal that repeats a pattern in which 0's continue for M cycles and 1's continue for L cycles.

Further, the generation device 12$d$ receives a first duration set value TB1 and a second duration set value TB2 from a device that controls the generation device 12$d$, for example. The first duration set value TB1 is equal to the number of cycles in the first duration, for example. The second duration set value TB2 is equal to the number of cycles in the second duration, for example. The generation device 12$d$ changes the first duration according to the received first duration set value TB1. The generation device 12$d$ changes the second duration according to the received second duration set value TB2.

The determination device 18$d$ acquires the input signal SI and the operation clock CLA from the reception device 16. The determination device 18$d$ determines in each clock cycle whether the input data in the input signal SI matches the output data in the output signal SOd. Then, the determination device 18*d* outputs a determination result indicating whether the input signal SI matches the output signal SOd.

Furthermore, the determination device 18*d* receives a first duration set value TA1 and a second duration set value TA2 that are respectively the same as the first duration set value TB1 and the second duration set value TB2 provided in the generation device 12*d*, from the device controlling the determination device 18*d*, for example. The determination device 18*d* changes the first duration and the second duration of the detection signal SD according to the received first duration set value TA1 and second duration set value TA2. For example, the determination device 18*d* changes the first duration and the second duration in the third generator polynomial or fifth generator polynomial described above in accordance with the first duration set value TA1 and the second duration set value TA2.

More specifically, if the first duration is longer than the second duration, the determination device 18*d* changes the value of L (number of cycles) in the third generator polynomial shown in Equation (3) in accordance with the first duration set value TA1, and changes the value of M (number of cycles) in accordance with the second duration set value TA2. In addition, if the second duration is longer than the first duration, the determination device 18*d* changes the value of M (number of cycles) in the fifth generator polynomial shown in Equation (5) in accordance with the first duration set value TA1, and changes the value of L (number of cycles) in accordance with the second duration set value TA2.

The test system 10*d* can perform a transmission test with a clock-like pattern having the first and second durations different from each other by changing the period and duty ratio of the clock-like pattern.

Figure 27:
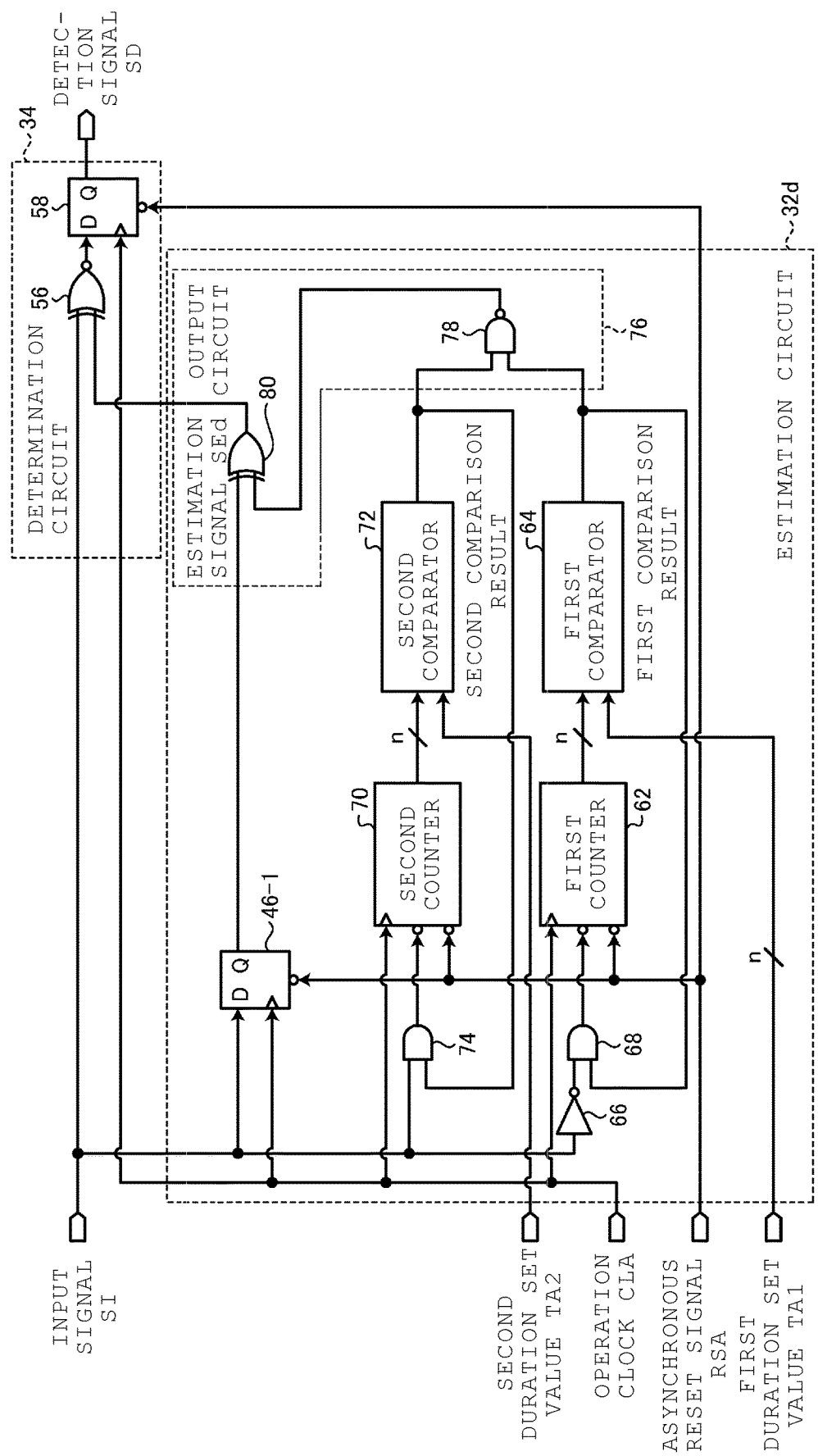
FIG. 27 is a configuration diagram of an estimation circuit and a determination circuit according to the fifth embodiment.

FIG. 27 is a diagram showing a configuration of an estimation circuit 32*d* and the determination circuit 34 according to the fifth embodiment. The determination device 18*d* according to the fifth embodiment has substantially the same configuration as that of the determination device 18*c* shown in FIG. 20. However, the estimation circuit 32*d* receives the first duration set value TA1 and the second duration set value TA2 instead of the period set value PA. Each of the first duration set value TA1 and the second duration set value TA2 is an integer of 1 or more represented by an n-bit width.

In the fifth embodiment, the first comparator 64 acquires the first duration set value TA1 instead of the period set value PA. The first comparator 64 outputs 0 as the first comparison result if the first count value and the first duration set value TA1 match, and outputs 1 as the first comparison result if the first count value and the first duration set value TA1 do not match. For example, if the number of cycles in the first duration is L, the first comparator 64 outputs 0 as the first comparison result if the first count value is L, and outputs 1 as the first comparison result if the first count value is other than L. If the number of cycles in the first duration is M, the first comparator 64 outputs 0 as the first comparison result if the first count value is M, and outputs 1 as the first comparison result if the first count value is other than M.

In the fifth embodiment, the second comparator 72 acquires the second duration set value TA2 instead of the period set value PA. The second comparator 72 outputs 0 as the second comparison result if the second count value and the second duration set value TA2 match, and outputs 1 as the second comparison result if the second count value and the second duration set value TA2 do not match. For example, if the number of cycles in the second duration is M, the second comparator 72 outputs 0 as the second comparison result if the second count value is M, and outputs 1 as the second comparison result if the second count value is other than M. If the number of cycles in the second duration is L, the second comparator 72 outputs 0 as the second comparison result if the second count value is L, and outputs 1 as the second comparison result if the second count value is other than L.

When the number of cycles in the first duration is L and the number of cycles in the second duration is M, in the n-th cycle, the estimation circuit 32*d* can output an inverted value of the input data in (n−1)-th cycle as the estimation data if a logical sum of all the input data from the (n−1)-th cycle to (n−L)-th cycle is 0 or a logical product of all the input data from the (n−1)-th cycle to (n−M)-th cycle is 1. In addition, in the n-th cycle, the estimation circuit 32*d* can output the same value as the input data in the (n−1)-th cycle as the estimation data if the logical sum of all the input data from the (n−1)-th cycle to the (n−L)-th cycle is not 0 and the logical product of all the input data from the (n−1)-th cycle to the (n−M)-th cycle is not 1.

In addition, when the number of cycles in the first duration is M and the number of cycles in the second duration is L, in the n-th cycle, the estimation circuit 32*d* can output the inverted value of the input data in the (n−1)-th cycle as the estimation data if the logical sum of all the input data from the (n−1)-th cycle to the (n−M)-th cycle is 0 or the logical product of all the input data from the (n−1)-th cycle to the (n−L)-th cycle is 1. In addition, in the n-th cycle, the estimation circuit 32*d* can output the same value as the input data in the (n−1)-th cycle as the estimation data if the logical sum of all the input data from the (n−1)-th cycle to the (n−M)-th cycle is not 0 and the logical product of all the input data from the (n−1)-th cycle to the (n−L)-th cycle is not 1.

Then, the estimation circuit 32*d* outputs in each clock cycle the estimation signal SEd including the calculated estimation data to the determination circuit 34.

If the number of cycles in the first duration is L and the number of cycles in the second duration is M, the estimation circuit 32*d* having the configuration described above can generate in each clock cycle the estimation data by estimating the input data by performing the operation of the third generator polynomial shown in Equation (3). In addition, if the number of cycles in the first duration is M and the number of cycles in the second duration is L, the estimation circuit 32*d* can generate in each clock cycle the estimation data by estimating the input data by performing the operation of the fifth generator polynomial shown in Equation (5). Furthermore, the estimation circuit 32*d* can change the period and duty ratio of the input signal SI to be estimated.

The first duration set value TA1 is equal to the number of cycles in the period of the first duration. Therefore, for example, the first duration set value TA1 is 1 if the first duration is 1 cycle, 2 if the first duration is 2 cycles, M if the first duration is M cycles, and L if the first duration is L cycles.

Further, the second duration set value TA2 is also equal to the number of cycles in the period of the second duration. In the present embodiment, the number of cycles in the first duration and the number of cycles in the second duration may be different from each other or the same as each other.

Figure 28:
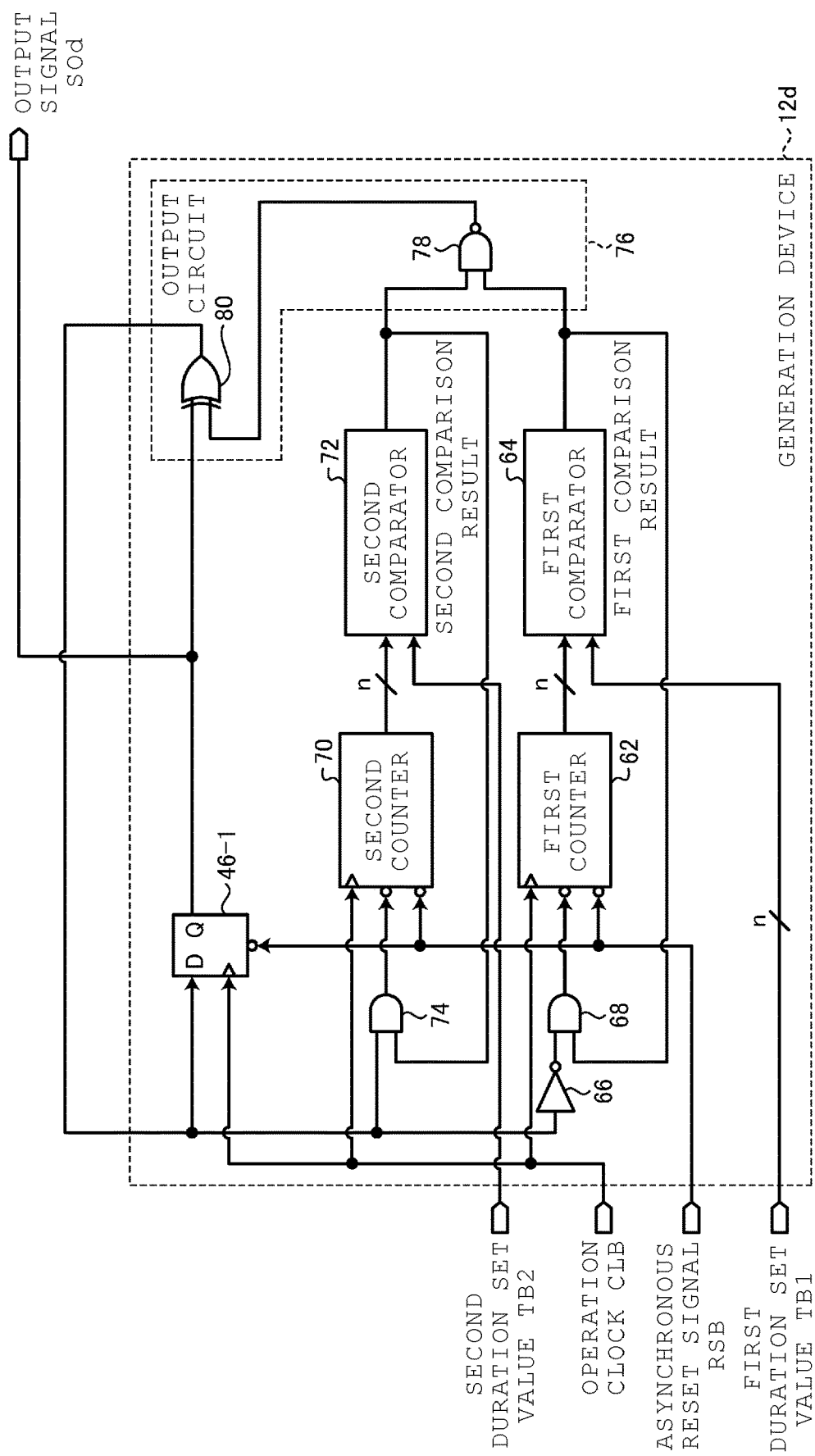
FIG. 28 is a configuration diagram of a generation device according to the fifth embodiment.

FIG. 28 is a diagram showing a configuration of the generation device 12*d* according to the fifth embodiment.

The generation device 12*d* according to the fifth embodiment has substantially the same configuration as the configuration of the estimation circuit 32d shown in FIG. 27. However, in the n-th cycle, instead of acquiring the input data in the n-th cycle in the input signal SI, the generation device 12d acquires the data in the n-th cycle generated by the generation device 12d as the input data. That is, instead of outputting the estimation data to the determination circuit 34 in the n-th cycle, the generation device 12d feeds back the generated data to itself. Then, the generation device 12d outputs the output data stored in the first D flip-flop 46-1 in each clock cycle to generate the output signal SOd.

If the number of cycles in the first duration is L and the number of cycles in the second duration is M, the generation device 12d having the configuration described above can generate in each clock cycle an output signal SOd with a clock-like pattern that alternately repeats a first duration in which 0's continue for L cycles and a second duration in which 1's continue for M cycles by performing the operation of the fourth generator polynomial expressed by Equation (4). In addition, if the number of cycles in the first duration is M and the number of cycles in the second duration is L, the generation device 12d can generate in each clock cycle an output signal SOd with a clock-like pattern that alternately repeats a first duration in which 0's continue for M cycles and a second duration in which 1's continue for L cycles by performing the operation of the second generator polynomial expressed by Equation (6).

It is noted that, without using the 4-th and 6-th generator polynomials, the generation device 12d may count the operation clocks CLB with a counter so as to generate the output signal SOd that repeats a pattern in which 0's continue in the first duration and 1's continue in the second duration.

FIG. 29 is a diagram showing an example of waveforms of the output signal SOd and the like generated by the generation device 12d according to the fifth embodiment.

The generation device 12d receives a first duration set value TB1 and a second duration set value TB2. The generation device 12d can output an output signal SOd with a clock-like pattern having a period and duty ratio corresponding to the received first duration set value TB1 and second duration set value TB2. In the example shown in FIG. 29, the generation device 12d receives a hexadecimal number "11h" as the first duration set value TB1, and a hexadecimal number "07h" as the second duration set value TB2. In addition, in the example shown in FIG. 29, the generation device 12d outputs an output signal SOd that repeats a pattern in which 0's continue for 17 cycles and 1's continue for 7 cycles.

FIG. 30 is a diagram showing an example of waveforms of the detection signal SD and the like generated by the determination device 18d according to the fifth embodiment.

The determination device 18d receives the first duration set value TA1 and the second duration set value TA2. The determination device 18d can output a detection signal SD that continuously is 1 in cycles in which the input signal SI matches a clock-like pattern corresponding to the received first duration set value TA1 and second duration set value TA2, and is 0 in cycles in which the input signal SI does not match the clock-like pattern. In the example shown in FIG. 30, the determination device 18d receives hexadecimal "11h" as the first duration set value TA1, and receives hexadecimal "07h" as the second duration set value TA2. In the example shown in FIG. 30, a detection signal SD is output, which is 1 if the input signal SI matches a clock-like pattern in which 0's continue for 17 cycles and 1's continue for 7 cycles, and is 0 if the input signal SI does not match the clock-like pattern.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A determination device comprising:
    an estimation circuit configured to:
        receive an input signal including input data indicating 0's or 1's in each clock cycle from outside the determination device;
        generate estimation data by estimating first input data in n-th cycle (n is an integer of 2 or more) based on second input data in cycles prior to the n-th cycle and based on a predetermined first generator polynomial; and
        output the estimation data,
    a determination circuit electrically connected to the estimation circuit and configured to;
        receive the first input data in the n-th cycle in the input signal from the outside the determination device;
        receive the estimation data from the estimation circuit; and
        determine whether the received first input data in the n-th cycle and the received estimation data in the n-th cycle match, wherein
    the first generator polynomial is an arithmetic expression configured to:
        set the estimation data in the n-th cycle to an inverted value of the input data in (n-1)-th cycle when a logical sum of all the input data in a first duration corresponding to a preset number of cycles prior to the (n-1)-th cycle is 0 or a logical product of all the input data in a second duration corresponding to the preset number of cycles prior to the (n-1)-th cycle is 1, and
        set the estimation data in the n-th cycle to the same value as the input data in the (n-1)-th cycle when the logical sum is not 0 and the logical product is not 1.

2. The determination device according to claim 1, wherein the determination circuit is configured to determine whether the input data and the estimation data match in each clock cycle.

3. The determination device according to claim 2, wherein the estimation circuit includes:
    a storage circuit configured to store the input data from the (n-1)-th cycle to (n-L)-th cycle, and
    an arithmetic circuit, wherein
    L represents the number of cycles in the first duration, and
    in the n-th cycle, the arithmetic circuit is configured to:
        output the inverted value of the input data in the (n-1)-th cycle as the estimation data when a logical sum of all the input data from the (n-1)-th cycle to the (n-L)-th cycle is 0 or a logical product of all the input data from the (n-1)-th cycle to the (n-L)-th cycle is 1, and
        output the same value as the input data in the (n-1)-th cycle as the estimation data when the logical sum is not 0 and the logical product is not 1.

4. The determination device according to claim 2, wherein the estimation circuit includes:

a storage circuit configured to store the input data from the (n-1)-th cycle to (n-L)-th cycle, and an arithmetic circuit, wherein L represents the number of cycles in the first duration, and in the n-th cycle, the arithmetic circuit is configured to:
output the inverted value of the input data in the (n-1)-th cycle as the estimation data when a logical sum of all the input data from the (n-1)-th cycle to (n-L)-th cycle is 0 or a logical product of all the input data from the (n-1)-th cycle to the (n-M)-th cycle is 1, and
output the same value as the input data in the (n-1)-th cycle as the estimation data when the logical sum is not 0 and the logical product is not 1, wherein M represents the number of cycles in the second duration, and

M<L.

5. The determination device according to claim 2, wherein the estimation circuit includes:
a storage circuit configured to store the input data from the (n-1)-th cycle to (n-L)-th cycle, and
an arithmetic circuit, wherein
L represents the number of cycles in the second duration, and
in the n-th cycle, the arithmetic circuit is configured to:
output the inverted value of the input data in the (n-1)-th cycle as the estimation data when a logical sum of all the input data from the (n-1)-th cycle to the (n-M)-th cycle is 0 or a logical product of all the input data from the (n-1)-th cycle to the (n-L)-th cycle is 1, and
output the same value as the input data in the (n-1)-th cycle as the estimation data when the logical sum is not 0 and the logical product is not 1, wherein
M represents the number of cycles in the first duration, and
M<L.

6. The determination device according to claim 1, wherein the estimation circuit includes:
a first counter configured to count up a first count value in each clock cycle and reset the first count value when the input signal includes a value of 1 or the first count value is a value representing the first duration,
a second counter configured to count up a second count value in each clock cycle and reset the second count value when the input signal includes a value of 0 or the second count value is a value representing the second duration, and
an output circuit, wherein the output circuit is configured to:
in each clock cycle,
output the inverted value of the input data in the (n-1)-th cycle as the estimation data when a first count value is a value representing the first duration or the second count value is a value representing the second duration, and
output the same value as the input data in the (n-1)-th cycle as the estimation data when a first count value does not represent the first duration and the second count value does not represent the second duration.

7. A test system comprising:
the determination device according to claim 1; and
a generation device configured to generate an output signal including output data corresponding to the input data in each clock cycle, wherein the output signal is transmitted to a transmitter device,
the determination device is configured to acquire the output signal as the input signal via the transmitter device, and
the output signal is a signal that repeats a pattern in which 0's continue in the first duration and 1's continue in the second duration.

8. The test system according to claim 7, wherein the determination circuit in the determination device is configured to determine whether the input data and the estimation data match in each clock cycle.

9. The test system according to claim 8, wherein the estimation circuit in the determination device includes:
a storage circuit configured to store the input data from the (n-1)-th cycle to (n-L)-th cycle, and
an arithmetic circuit, wherein
L represents the number of cycles in the first duration, and
in the n-th cycle, the arithmetic circuit is configured to:
output the inverted value of the input data in the (n-1)-th cycle as the estimation data when a logical sum of all the input data from the (n-1)-th cycle to the (n-L)-th cycle is 0or a logical product of all the input data from the (n-1)-th cycle to the (n-L)-th cycle is 1, and
output the same value as the input data in the (n-1)-th cycle as the estimation data when the logical sum is not 0 and the logical product is not 1.

10. The test system according to claim 8, wherein the estimation circuit in the determination device includes:
a storage circuit configured to store the input data from the (n-1)-th cycle to (n-L)-th cycle, and
an arithmetic circuit, wherein
L represents the number of cycles in the first duration, and
in the n-th cycle, the arithmetic circuit is configured to:
output the inverted value of the input data in the (n-1)-th cycle as the estimation data when a logical sum of all the input data from the (n-1)-th cycle to (n-L)-th cycle is 0 or a logical product of all the input data from the (n-1)-th cycle to the (n-M)-th cycle is 1, and
output the same value as the input data in the (n-1)-th cycle as the estimation data when the logical sum is not 0 and the logical product is not 1, wherein
M represents the number of cycles in the second duration, and
M<L.

11. The test system according to claim 8, wherein the estimation circuit in the determination device includes:
a storage circuit configured to store the input data from the (n-1)-th cycle to (n-L)-th cycle, and
an arithmetic circuit, wherein
L represents the number of cycles in the second duration, and
in the n-th cycle, the arithmetic circuit is configured to:
output the inverted value of the input data in the (n-1)-th cycle as the estimation data when a logical sum of all the input data from the (n-1)-th cycle to the (n-M)-th cycle is 0 or a logical product of all the input data from the (n-1)-th cycle to the (n-L)-th cycle is 1, and
output the same value as the input data in the (n-1)-th cycle as the estimation data when the logical sum is not 0 and the logical product is not 1, wherein
M represents the number of cycles in the first duration, and
M<L.

12. The test system according to claim 7, wherein the estimation circuit in the determination device includes:

a first counter configured to count up a first count value in each clock cycle and reset the first count value when the input signal includes a value of 1 or the first count value is a value representing the first duration, a second counter configured to count up a second count value in each clock cycle and reset the second count value when the input signal includes a value of 0 or the second count value is a value representing the second duration, and an output circuit, wherein the output circuit is configured to:
   in each clock cycle,
      output the inverted value of the input data in the (n-1)-th cycle as the estimation data when a first count value is a value representing the first duration or the second count value is a value representing the second duration, and
      output the same value as the input data in the (n-1)-th cycle as the estimation data when a first count value does not represent the first duration and the second count value does not represent the second duration.

13. A generation device configured to generate an output signal including output data indicating 0's or 1's in each clock cycle of a clock signal, the device comprising:
   a first terminal configured to receive the clock signal;
   a circuit configured to generate the output data in the n-th cycle of the received clock signal based on the output data transmitted in cycles prior to the n-th cycle and based on a predetermined first generator polynomial to output the output signal including the generated output data; and
   a second terminal configured to output the generated output data;
   wherein the first generator polynomial is an arithmetic expression configured to:
      set the output data in the n-th cycle to an inverted value of the output data in (n-1)-th cycle when a logical sum of all the output data in a first duration corresponding to a preset number of cycles prior to the (n-1)-th cycle is 0 or a logical product of all the output data in a second duration corresponding to the preset number of cycles prior to the (n-1)-th cycle is 1, and
      set the output data in the n-th cycle to the same value as the output data in the (n-1)-th cycle when the logical sum is not 0 and the logical product is not 1.

14. A determination method of a determination device including a first circuit and a second circuit, the method comprising:
   receiving an input signal including input data indicating 0's or 1's in each clock cycle from outside the determination device to the first and second circuits;
   generating, in the first circuit, estimation data by estimating first input data in n-th cycle (n is an integer of 2 or more) based on second input data in cycles prior to the n-th cycle and based on a predetermined first generator polynomial;
   sending the estimation data from the first circuit to the second circuit; and
   determining, in the second circuit, whether the first input data in the n-th cycle in the input signal received from the outside the determination device and the received estimation data in the n-th cycle match, wherein
   the first generator polynomial is an arithmetic expression configured to:
      set the estimation data in the n-th cycle to an inverted value of the input data in (n-1)-th cycle when a logical sum of all the input data in a first duration corresponding to a preset number of cycles prior to the (n-1)-th cycle is 0 or a logical product of all the input data in a second duration corresponding to the preset number of cycles prior to the (n-1)-th cycle is 1, and
      set the estimation data in the n-th cycle to the same value as the input data in the (n-1)-th cycle when the logical sum is not 0 and the logical product is not 1.

15. The determination method according to claim 14, further comprising determining whether the input data and the estimation data match in each clock cycle.

* * * * *